United States Patent [19]

Sekiguchi

[11] Patent Number: 5,299,045
[45] Date of Patent: Mar. 29, 1994

[54] LIGHT DETECTING APPARATUS HAVING A DIFFRACTION GRATING

[75] Inventor: Yoshinobu Sekiguchi, Zama, Japan

[73] Assignee: Canon Kabushiki Kaisha, Tokyo, Japan

[21] Appl. No.: 819,387

[22] Filed: Jan. 10, 1992

[30] Foreign Application Priority Data

Jan. 12, 1991 [JP] Japan ................... 3-013903
Jan. 12, 1991 [JP] Japan ................... 3-013904
Jan. 12, 1991 [JP] Japan ................... 3-013905

[51] Int. Cl.$^5$ .................. H04B 10/12; H04J 14/02
[52] U.S. Cl. .................. 359/130; 359/132; 359/188; 385/10
[58] Field of Search .......... 385/10, 24; 359/130, 359/188, 195, 173, 154, 132

[56] References Cited

U.S. PATENT DOCUMENTS

| | | | |
|---|---|---|---|
| 3,908,121 | 9/1975 | Riseberg | 359/130 |
| 4,696,536 | 9/1987 | Albares et al. | 350/96.19 |
| 4,773,063 | 9/1988 | Hunsperger | 359/130 |
| 4,776,661 | 10/1988 | Handa | 350/96.19 |
| 4,794,609 | 12/1988 | Hara et al. | 372/50 |
| 4,852,079 | 7/1989 | Kinney | 359/130 |
| 4,896,328 | 1/1990 | Sekiguchi et al. | 372/50 |
| 4,917,450 | 4/1990 | Pocholk | 385/10 |
| 4,970,713 | 11/1990 | Imoto | 359/114 |
| 4,976,539 | 12/1990 | Carlson | 359/154 |
| 5,019,787 | 5/1991 | Carlson | 359/173 |
| 5,077,816 | 12/1991 | Glomb | 359/130 |
| 5,078,499 | 1/1992 | LaMarche | 359/115 |
| 5,131,060 | 7/1992 | Sakata | 359/130 |

FOREIGN PATENT DOCUMENTS

| | | |
|---|---|---|
| 0284908 | 10/1988 | European Pat. Off. |
| 0315512 | 10/1989 | European Pat. Off. |
| 400559 | 12/1990 | European Pat. Off. |
| 63-116489 | 9/1988 | Japan . |
| 0087581 | 3/1990 | Japan .......... 359/130 |

OTHER PUBLICATIONS

"Refractive Index of GaAs-AlAs Superlattice Grown by MBE" by Y. Suzuki et al.; Journal of Electronic Materials, vol. 12, No. 2, Mar. 1983 pp. 397-411.
Proc. 5th Europ. Conf. On Integrated Optics (ECIO '89); SPIE vol. 1141 1989; Bellingham, US. pp. 192-200, Lukosz et al.: "Output grating couplers sensors".

Primary Examiner—Leslie Pascal
Attorney, Agent, or Firm—Fitzpatrick, Cella, Harper & Scinto

[57] ABSTRACT

A light detector provides wavelength tracking, monitoring or similar function by forming a diffraction grating in a light waveguide. Diffracted light from the waveguide is received by a light detecting device having multiple detecting portions. Changes in the emission angle of the diffracted light caused by the wavelength or other fluctuation of the incident light are detected. The detected information can be used for wavelength tracking by injecting current into or applying a voltage to the waveguide to regulate the Bragg wavelength of the light waveguide, for monitoring and/or controlling the oscillation wavelength of a semiconductor laser or for other purposes.

28 Claims, 16 Drawing Sheets

LIGHT DETECTING APPARATUS HAVING A DIFFRACTION GRATING

BACKGROUND OF THE INVENTION

1. Field of the Invention

This invention relates to light detecting apparatus to be used in optical communication and so forth. The light detecting apparatus detects or monitors wavelength fluctuations of a received light and the detected information is used for a wavelength tracking in a filtering or demultiplexing portion of the apparatus, or to control an oscillation wavelength and/or output power of a laser device coupled to the light detecting apparatus. The light detecting apparatus may preferably be used in a transmitter or receiver end office of an optical communication network or system.

2. Related Background Art

Conventionally, a wavelength band width per one signal wavelength is set considerably wide, such as 20 nm, in a wavelength division multiplexing communication system in which a plurality of signal wavelengths are distributed over a band arround 0.8 μm, is consideration of the performance of a filter disposed at the side of a signal receiver. Therefore, even if the wavelength of a received light fluctuates to some extent in such wavelength band, a signal can be received well at the receiver side and there is no obstacle to the wavelength division multiplexing communication. As a result, a wavelength tracking operation is not needed for each signal wavelength at the receiver side.

In such a prior art example, however, it is difficult to increase the multiplexing degree or multiplicity of signal wavelengths since the band width per one signal wavelength is set wide, and hence the advantage of wavelength division multiplexing communication is not sufficiently utilized although the wavelength tracking operation is dispensable.

SUMMARY OF THE INVENTION

An object of the present invention is to provide, in view of the above problem, light detecting apparatus having wavelength fluctuation detection of received light, which can be used for various purposes, such as increasing the signal wavelength multiplicity by setting a narrow wavelength band width for each signal wavelength in a wavelength division multiplexing communication.

Another object of the present invention is to provide, in view of the above problem, light detecting apparatus for a laser apparatus which is a light source at the receiver side, having an oscillation wavelength and/or output power monitoring function, which can be used for purposes, such as increasing the signal wavelength multiplicity by setting a narrow wavelength band width per signal wavelength in the wavelength division multiplexing communication.

Still another object of the present invention is to provide, in view of the above problem, an optical communication network including the above-mentioned light detecting apparatus.

Feed back arrangements and use of the detected signal of the light detecting apparatus of the present invention, however, are not limited to the wavelength tracking function.

The invention is directed to a light detection arrangement in which a diffraction grating is formed in a light waveguide. A detector detects diffraction light from the waveguide and a signal is applied to the waveguide.

According to a first aspect of the light detecting apparatus of the present invention, there are provided a semiconductor light waveguide on which light is incident, a diffraction grating formed in the light waveguide, an electrode for injecting current into the waveguide and a light detecting device including a plurality of portions for detecting a diffraction light emitted outside of the waveguide.

More concretely, the light detecting device is comprised of an array of plural light detecting elements or photodetectors.

In the structure of an embodiment according to the first aspect, the change of an emission angle of the diffraction light due to the wavelength fluctuation of the incident light on the waveguide is detected by the light detecting device, and, for example, the Bragg wavelength of the waveguide is changed based on the detected information by the control of the current injected into the waveguide so that the diffraction light is always incident on a determined portion of the light detecting device. In this case, a change in refractive index of the waveguide resulting from the carrier injection thereinto or to a plasma effect and so forth, is utilized.

According to a second aspect of the light detecting apparatus of the present invention, there are provided a semiconductor light waveguide on which light is incident, a diffraction grating formed in the light waveguide, an electrode for applying voltage to the waveguide, a light detecting device including a plurality of portions for detecting a diffraction light emitted outside of the waveguide and at least one quantum well layer formed in a range within a distance of light wavelength from an area where the diffraction grating is formed.

More concretely, the thickness of the quantum well layer is equal to or less than a de Broglie wavelength, and the light detecting device comprises of an array of plural light detecting elements or photodetectors.

In the structure of an embodiment according to the second aspect, the change of an emission angle of the diffraction light due to the wavelength fluctuation of the incident light on the waveguide is detected by the light detecting device, and, for example, the Bragg wavelength of the waveguide is changed by the control of the voltage applied to the waveguide based on the detected information so that the diffraction light is always incident on a determined portion of the light detecting device. Here, the width of change in the Bragg wavelength of the diffraction grating is widened by utilizing the quantum well layer structure. As a result, the width of the wavelength tracking is enlarged, and a response characteristic at the time of the change in the Bragg wavelength is improved.

According to a third aspect of the light detecting apparatus of the present invention, there are provided a semiconductor light waveguide on which light is incident, a diffraction grating formed in the light waveguide, an electrode for applying voltage to the waveguide, a light detecting device including a plurality of portions for detecting a diffraction light emitted outside of the waveguide and at least two quantum well layers and a barrier layer therebetween formed in a range within a distance of light wavelength from an area where the diffraction grating is formed. The barrier layer has such thickness and potential shape that can change a bonding state between the quantum well layers due to the change of the voltage applied to the waveguide. As a result, the width of change in wavelength is still enlarged.

More concretely, the thickness of the quantum well layer is equal to or less than a de Broglie wavelength, the detecting device comprises an array of plural light detecting elements or photodetectors, the conduction type of the quantum well layer is set to one of p and n types and the barrier is formed with a high resistance material. The potential of the barrier layer is formed such that it inclines in a flat band state (i.e., non-voltage state), and the quantum well layer and the barrier layer are respectively formed with $Al_xGa_{1-x}As$ and $Al_yGa_{1-y}As$ ($0 \leq x < y \leq 1$) and the thickness of the barrier layer is no less than 3 nm and no greater than 15 nm.

According to a fourth aspect of the light detecting apparatus of the present invention, there are provided a semiconductor light waveguide on which light is incident, a diffraction grating which is formed in the light waveguide for the incident light, an electrode for applying voltage to or injecting current into the waveguide and a plurality of photodetectors for receiving a diffraction light outside of the waveguide. The photodetectors include a photodetector having a shorter light receiving surface in a direction of the waveguide extention and a photodetector having a longer light receiving surface in the same direction. Such a structure can detect an incident light having a wavelength which deviates considerably from the Bragg wavelength of the diffraction grating, and hence rapid wavelength tuning is possible. Further, such a structure is capable of simultaneously demultiplexing and detecting light signals of selected wavelengths of wavelength-multiplexed light signals.

According to a fifth aspect of the light detecting apparatus of the present invention, there are provided a semiconductor light waveguide on which light is incident, a diffraction grating which is formed in the light waveguide, an electrode for applying voltage to or injecting current into the waveguide, and a plurality of arrays of photodetectors for receiving a diffraction light emitted outside of the waveguide. The arrays of the photodetectors in a direction of the waveguide extension are arranged such that light receiving surfaces of the photodetectors are continuously extended in the same direction as a whole. According to such a structure, the light detecting apparatus can be compact in size and a wavelength resolution of the light detecting apparatus can be improved by shortening the length of the light receiving surface in the waveguide extension direction.

According to a sixth aspect of the light detecting apparatus of the present invention, there are provided a semiconductor light waveguide on which light is incident, a diffraction grating formed in the light waveguide, a plurality of photodetectors disposed for receiving a diffraction light emitted outside of the waveguide, a control device for changing the Bragg wavelength of the waveguide by the change in current injected into or voltage applied to the waveguide, and at least one optical amplifier portion in which an electrode for current injection is formed on the waveguide. An antireflection coat is formed on the light incident surface when the optical amplifier portion is disposed at the light incident end, for increasing an amplification factor. In such a structure, though a signal light is amplified and at the same time spontaneous emission light overlaps in the optical amplifier portion, the increase of noise is small and a minimum detection sensitivity can be greatly improved since the amount of spontaneous light for unit wavelength is small.

According to an aspect of the light detecting apparatus for the laser device for monitoring the oscillation wavelength and/or output power of the laser device of the present invention, there are provided a semiconductor light waveguide provided on an optical axis of a semiconductor laser, a diffraction grating which is formed in the light waveguide, an electrode for applying voltage to or injecting current into the waveguide, and a light detecting device having a plurality of portions for detecting a diffraction light emitted outside of the waveguide. In such a structure, the light detecting device detects the change in an emission angle of the diffraction light due to the wavelength fluctuation of the incident light on the waveguide in the monitoring portion and the like, and the detected information is fed back to the semiconductor laser to maintain the oscillation wavelength and/or output power of the semiconductor laser to a desired value.

According to an aspect of the optical communication network of the present invention, there are provided a transmitter end office for transmitting light signals having different wavelengths, a receiver end office for receiving the light signals and a light transmission line for connecting these transmitter and receiver end offices. At least one of the receiver end offices is provided with the light detecting apparatus of the present invention. At least one of the transmitter end offices may be provided with the light detecting apparatus having the semiconductor laser of the present invention.

These advantages and others will be more readily understood in connection with the following detailed description, claims and drawings.

DESCRIPTION OF THE PREFERRED EMBODIMENT

First embodiment

Figure 1:
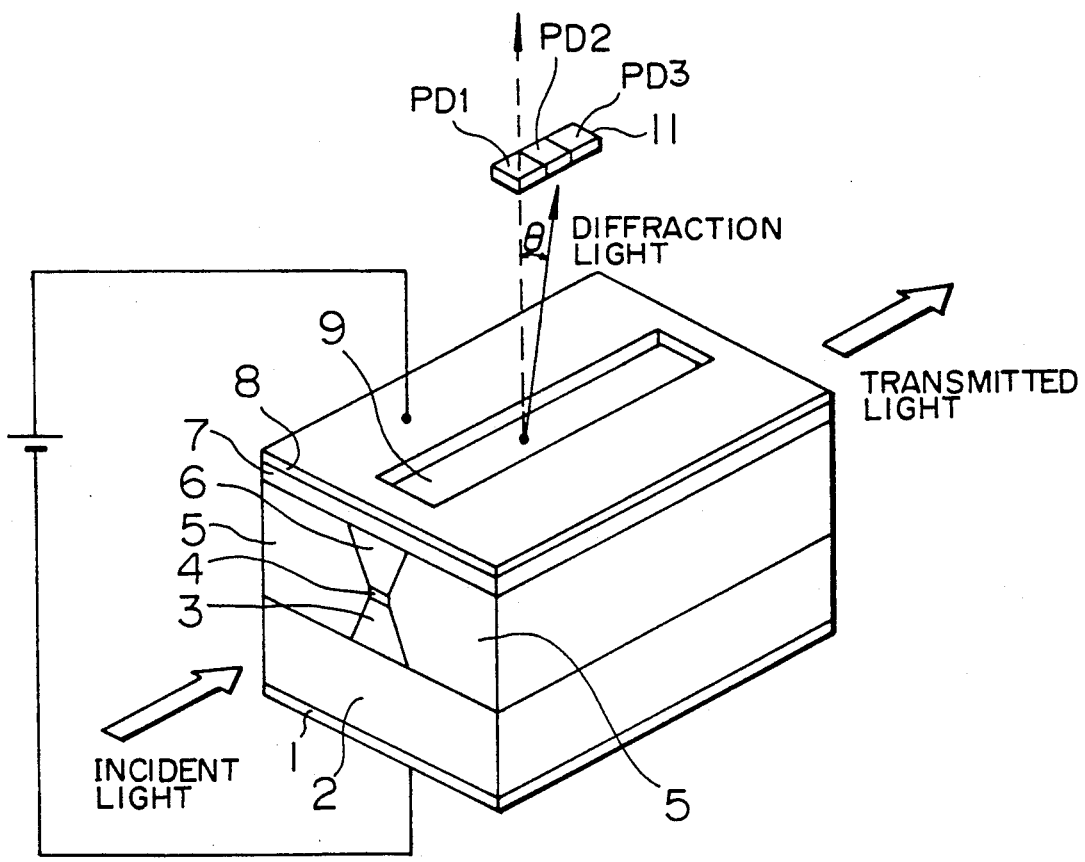
FIG. 1 is a perspective view of a first embodiment of a light detecting apparatus of the present invention having a light waveguide with a diffraction grating and a light detecting device.

The first embodiment of the present invention will be described by referring to FIGS. 1 and 2. In FIG. 1 illustrating the entire structure of the first embodiment, there are formed, on an n-GaAs substrate 2, an n—$Al_x$-$Ga_{1-x}As$ light confinement layer 3, an $Al_yGa_{1-y}As$ light waveguide layer 4 ($0 \leq y < x < 1$), the energy gap of the light confinement layer 3 is larger than that of the light waveguide layer 4, and the refractive index of the layer 3 is smaller than that of the layer 4 to perform the light confinement function, a p—$Al_xGa_{1-x}As$ light confinement layer 6 and a p—$Al_zGa_{1-z}As$ contact layer 7 ($0 < z < 1$) in this order. A high-resistance $Al_xGa_{1-x}As$ burying layer 5 is layered by a re-growth after both lateral sides are etched except for a stripe-shaped portion in order to achieve confinement with respect to a lateral direction.

On the contact layer 7, there is formed an upper p-type electrode 8 in which a window 9 for emitting a diffraction light is formed, and on the bottom of the n-GaAs substrate 2, an n-type electrode 1 is formed. A diffraction grating (not shown) is formed in the $Al_yGa_{1-y}As$ light waveguide layer 4 or at a location within a light wavelength distance from the waveguide layer 4. Furthermore, an array 11 of light detecting elements consisting of three elements PD1, 2 and 3 is disposed right above the window 9 for emitting diffraction light from the waveguide.

In the above-discussed structure, diffraction light is emitted above the waveguide when the incident light is input into the waveguide since the diffraction grating is formed in the waveguide layer 4 or in the vicinity of the waveguide including the waveguide layer 4.

Here, an inclination or emission angle $\theta$ of the diffraction light from a direction perpendicular to the waveguide has the following relation with a pitch $\Lambda$ of the diffraction grating and the wavelength of the incident light:

$$\sin \theta = n_{ef} - q\lambda/\Lambda \qquad (1)$$

where q is an integer and $n_{ef}$ is an equivalent refractive index of the waveguide.

Since the inclination angle $\theta$ of a diffraction light approximately normal to the waveguide is substantially equal to zero ($\theta \approx \sin \theta \approx 0$), the pitch $\Lambda$ of the diffraction grating is set to $\Lambda \approx q\lambda/n_{ef}$. The change $d\theta$ of the inclination angle $\theta$ relative to the change $d\lambda$ of wavelength of the incident light is given by differentiating the equation (1):

$$d\theta/d\lambda = (dn_{ef}/d\lambda - q/\Lambda) \qquad (2)$$

In this embodiment, the equivalent refractive index of the waveguide is in a range of 3.4~3.5, and therefore, the pitch of the diffraction grating is set to about 0.24 $\mu m$ for the incident light in 0.8 $\mu m$ band, where q=1. In this case, the change of the inclination angle relative to the change in wavelength of the incident light is given by $$d\theta/d\lambda \approx -0.3 \sim -0.4 \text{ deg/nm}.$$

The far field pattern (FFP) of the diffraction light is very narrow in the direction of the waveguide extension and its span angle $\theta_p$ is about 0.2 degrees. The FFP is wide in a direction transverse to the waveguide extension and its span angle $\theta_t$ is about 15 degrees. Therefore, if the wavelength of the incident light varies about 0.5 nm, the emission or inclination angle $\theta$ is changed by about 0.2 degrees. Thus, the inclination angle $\theta$ is changed in the waveguide extension direction by about a beam diameter of the diffraction light. As a result, the wavelength change of about 0.5 nm can be detected if the size of the light receiving surface of each element PD 1, 2 and 3 in the waveguide extension direction of the array 11 of the light detecting elements is set to about the beam diameter $\theta_p$ of the diffraction light.

The wavelength resolution is limited by the span angle $\theta_p$ in the waveguide extension direction of the diffraction light diffracted upward. Therefore, if the span angle $\theta_p$ is further narrowed, the wavelength resolution can be improved. This is achieved by reducing the coupling efficiency between the light waveguide and the diffraction grating of the waveguide and elongating the length of the waveguide.

Figure 2:
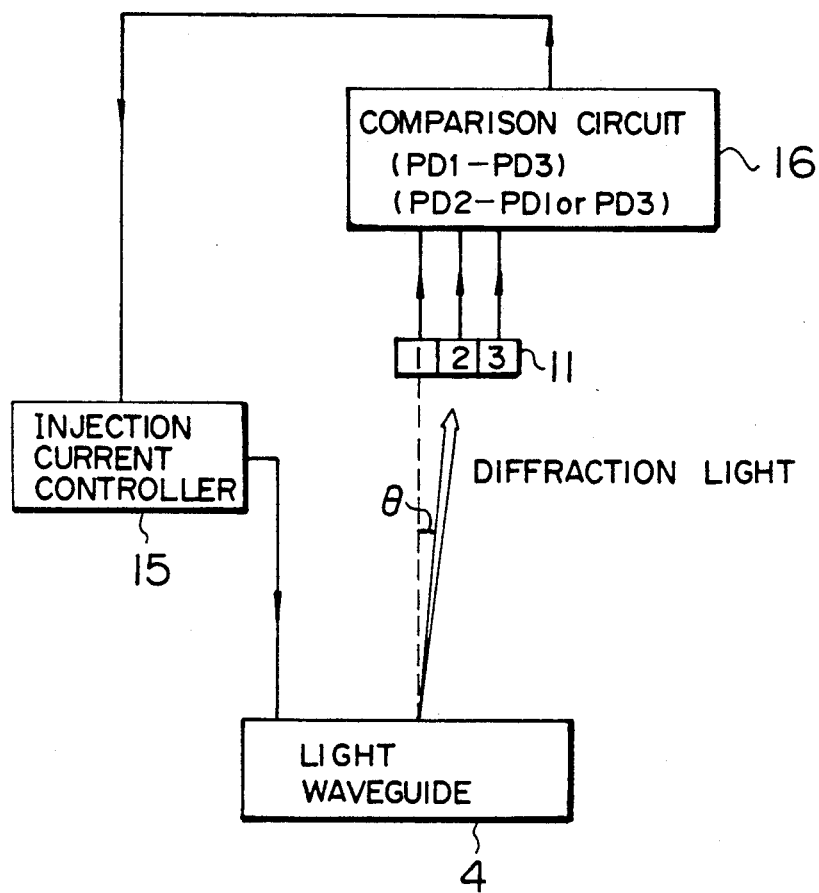
FIG. 2 is a block diagram of a structure for performing a wavelength tracking function of the first embodiment.

FIG. 2 shows a block diagram of the light detecting apparatus of FIG. 1 having a wavelength tracking function. In FIG. 2, as an initial setting before starting the communication, the Bragg wavelength of the diffraction grating is changed by controlling the injection current into the light waveguide with an injection current control circuit 15 so that the strongest region of the intensity distribution of the diffraction light of the incident light on the light waveguide is incident on a central element PD 2 of the array 11 of the light detecting elements. At this time, incident light quantities on the other light detecting elements PD 1 and PD 3 are set to be equal to each other or zero. In such a state, the communication will be started.

If the wavelength of the incident light becomes longer while such light is being received, the light received by the detecting element PD 2 decreases and at the same time the light received by the detecting element PD 1 increases while that on the detecting element PD 3 decreases or remains unchanged at zero. Changes in amount and wavelength of the incident light can be known by calculating PD 1 (the amount of incident light on the detecting element PD 1)−PD 3 and PD 2−PD 1 (or PD 3) with a comparison circuit 16. The injection current control circuit 15 is then controlled by the comparison circuit 16 to decrease the injection current into the light waveguide, so that the Bragg wavelength of the diffraction grating is shifted to a longer value. The strongest region of the diffraction light is caused to enter the central detecting element PD 2 by making the incident light on the detecting elements PD 1 and PD 3 equal or zero. On the other hand, when the wavelength of the incident light becomes shorter and the incident light is changed reversely, the Bragg wavelength of the diffraction grating is shifted to a shorter value by increasing the injection current into the light waveguide. Thus, the emission angle of the diffraction light is similarly controlled. Accordingly, even if the wavelength of the incident light is changed, the diffraction light from the light waveguide is caused to always be incident on the central detecting element PD 2 of the light detecting element array 11 to perform the waveguide tracking of the incident light. Here, the relationship between the injection current and the Bragg wavelength of the diffraction grating has been measured beforehand and is stored in the injection current control circuit 15.

Second embodiment

Figure 3:
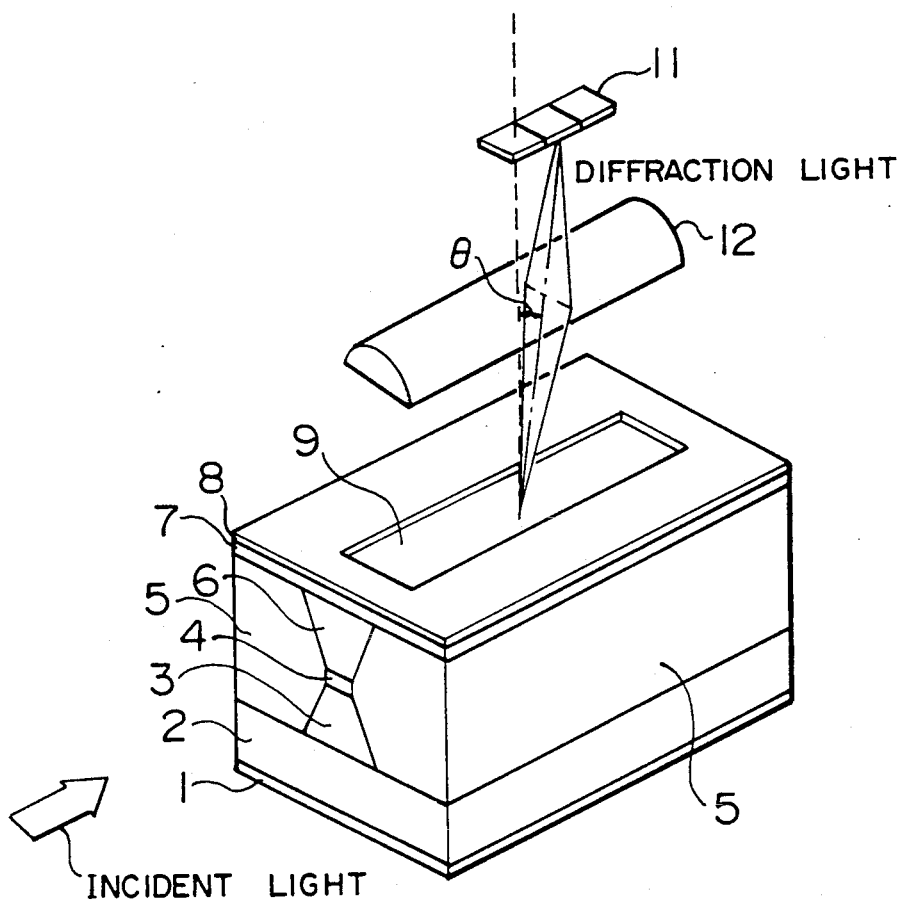
FIG. 3 is a perspective view of a second embodiment of a light detecting apparatus of the present invention having a light waveguide with a diffraction grating and a light detecting device.

FIG. 3 shows the second embodiment. As explained above, the far field pattern (FFP) of the diffraction light emitted from the light waveguide is very narrow in the direction of the waveguide extension and its span angle $\theta_P$ is about less than 0.2 degrees. The FFP is wide in a direction transverse to the waveguide extension and its span angle $\theta_t$ is about 15 degrees. Thus, since the span angle in the direction transverse to the waveguide extention is large, the amount of the incident light on the array 11 of the light detecting elements becomes a few percent of a total amount of the emitted light.

In the second embodiment, a cylindrical lens 12 is disposed between the light waveguide and the light detecting element array 11 so that the diffraction light is condensed with respect to the direction transverse to the waveguide extension to increase the amount of the incident light on the array 11. As a result, the wavelength tracking can be effectively conducted even if the light incident on the light waveguide is weak in intensity. The other structure and the operation of the second embodiment are the same as those of the first embodiment. In FIG. 3, the same reference numerals as those of FIG. 1 designate the same portions and elements as those of FIG. 1.

Third embodiment

Figure 4:
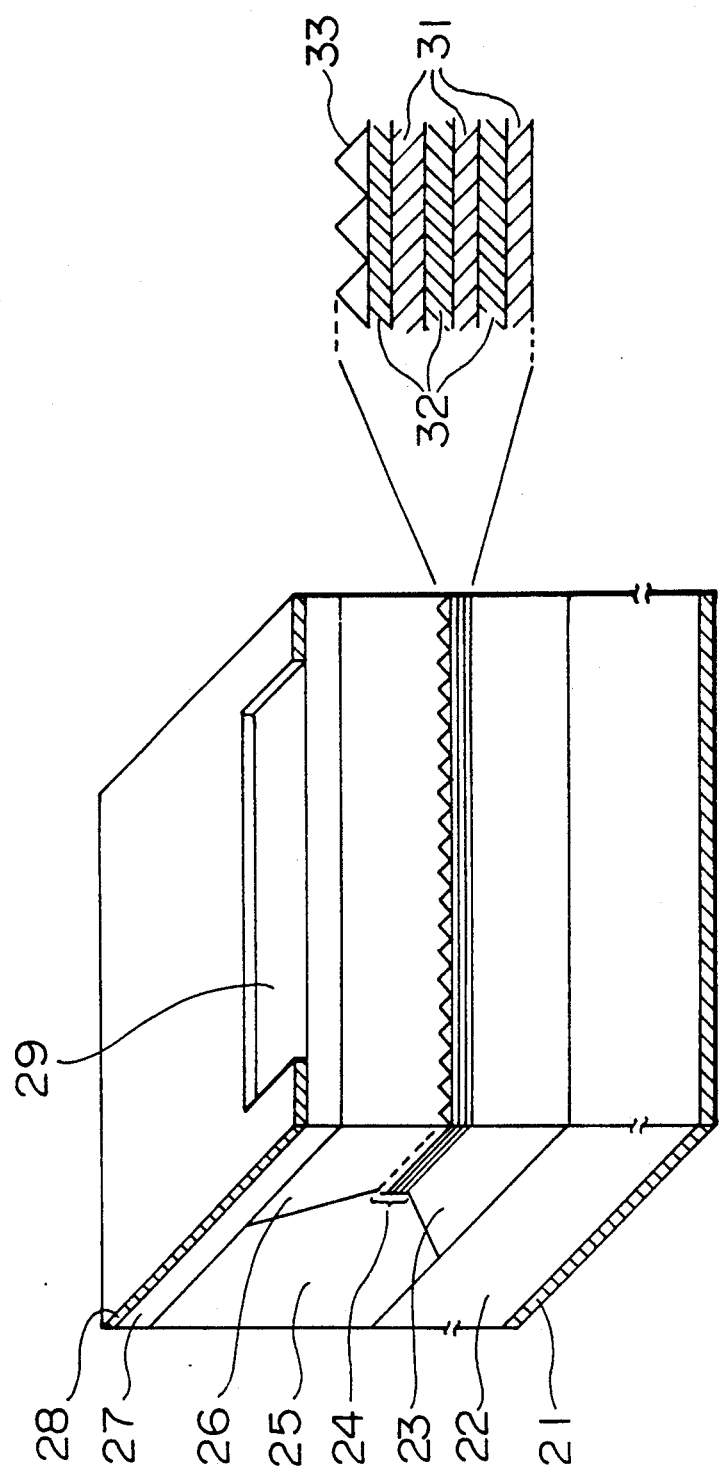
FIG. 4 is a partial cross-sectional view showing a portion of a third embodiment of a light detecting apparatus of the present invention having a light waveguide with a diffraction grating and a light detecting device.

The third embodiment of the present invention will be described by referring to FIG. 4. FIG. 4 shows a left half of the third embodiment of the light detecting apparatus as viewed from the light incident side. In FIG. 4, there are formed, on an n-GaAs substrate 22, an n-$Al_xGa_{1-x}As$ cladding layer 23, a superlattice waveguide layer 24 in which ten GaAs well layers 31 (thickness thereof is 10 nm) and eleven $Al_yGa_{1-y}As$ barrier layers 32 (thickness thereof is 10 nm; $0 \leq y < x < 1$) are alternately layered, a second order diffraction grating 33 having a pitch of about 260 nm, a p-$Al_xGa_{1-x}As$ cladding layer 26 and a p-$Al_zGa_{1-z}As$ contact layer 27 in this order. A high-resistance $Al_xGa_{1-x}As$ burying layer 25 is re-grown after the etching of both sides except for a stripe-shaped portion in order to achieve confinement in a lateral direction. On the contact layer 27, there is formed an upper p-type electrode 28 in which a window 29 for emitting a diffraction light is formed, and on the bottom of the n-GaAs substrate 22, an n-type electrode 21 is formed.

In such a structure, the quantum well 31 is formed at a location within a light wavelength distance from the diffraction grating 33 and its thickness is no greater than the de Broglie wavelength. Furthermore, the array 11 of light detecting elements consisting of three elements PD 1, 2 and 3 is disposed right above the window 29 for emitting the diffraction light from the waveguide, similar to the first embodiment.

In the above-discussed structure, the diffraction light is emitted above the waveguide when the incident light is input into the waveguide since the diffraction grating 33 is formed in the waveguide layer 24 or in the vicinity of the waveguide including the waveguide layer 24. At this time, the diffraction light is emitted in a direction perpendicular to the waveguide extension if the wavelength of the incident light is equal to the Bragg wavelength of the diffraction grating 33. Such a phenomenonis identical with that in the first embodiment.

The third embodiment differs from the first embodiment in that no current is injected into the superlattice waveguide layer 24 but a reverse bias voltage is applied thereto. The Bragg wavelength of the diffraction grating 33 is 870 nm when no bias voltage is applied, and the absorption edge of the quantum well structure 31 and 32 is 850 nm. Therefore, loss of the light having the Bragg wavelength (this is the incident light) in the quantum well structure 31 and 32 is quite low. When the bias voltage of −5 V is applied through the electrode 28, the Bragg wavelength of the diffraction grating 33 is reduced by about 7 nm. This results from a large change in the refractive index due to the quantum confinement Stark effect (QCSE effect) in the quantum well structure 31 and 32. Thus, the band range of the wavelength tracking of the light detecting apparatus having the wavelength tracking function and comprising the light waveguide with the diffraction grating 33 and the light detecting elements PD 1, 2 and 3 is expanded to a range of 863∼870 nm, compared with the changeable width of the Bragg wavelength (about several nanometers) due to the plasma effect and the like caused by the current injection into the light waveguide. Furthermore, the response time at the time of changing the wavelength is greatly improved to about 500 psec, compared with the case where carriers are injected (in this case, the response time is slow, such as several nsec, since time is required for the carrier injection), because no time is needed for injecting carriers into the light waveguide.

The operation of the third embodiment is substantially the same as that of the first embodiment.

As an initial setting before starting communication, the Bragg wavelength of the diffraction grating 33 is changed by controlling the applied voltage to the light waveguide so that the strongest region of the intensity distribution of the diffraction light of the incident light on the light waveguide is incident on a central element PD 2 of the array 11 of the light detecting elements. At this time, incident light on the other detecting elements PD 1 and PD 3 is set equal or zero. In such a state, the communication will be started.

If the wavelength of the incident light increases while such light is being received, the amount of received light on the detecting element PD 2 is decreased and at the same time the amount of received light on the detecting element PD 1 increases while that on the detecting element PD 3 decreases or remains unchanged at zero. Changes in amount and wavelength of the incident light can be known by calculating PD 1 (the amount of incident light on the detecting element PD 1) −PD 3 and PD 2−PD 1 (or PD 3) with a comparison means. Then, a voltage applying means is controlled by the comparison means to decrease the applied voltage to the light waveguide, so the Bragg wavelength of the diffraction grating is shifted to a longer value. The strongest region of the diffraction light is caused to enter the central detecting element PD 2 by making the incident light on the detecting elements PD 1 and PD 3 equal or zero.

On the other hand, when the wavelength of the incident light decreases and the amount of the incident light is changed reversely, the Bragg wavelength of the diffraction grating is decreased by increasing the applied voltage to the light waveguide. Thus, the emission angle of the diffraction light is similarly controlled. Accordingly, even if the wavelength of the incident light is changed, the diffraction light from the light waveguide is always incident on the central detecting element PD 2 of the light detecting element array 11 to perform the waveguide tracking of the incident light. Here, the relationship between the applied voltage and the Bragg wavelength of the diffraction grating has been measured prior to the communication and is stored in the voltage applying means.

Fourth embodiment

First, the operation principle of the fourth embodiment will be explained. In a superlattice structure, when a barrier layer is thin and quantum wells are in a bonding state, the refractive index ($n_1$) of the superlattice structure is about equal to that ($n_A$) of a mixed crystal (mixed crystal that contains constituent components of the superlattice structure at an equal ratio to that of the superlattice structure) of the barrier layer and the quantum well layers (i.e., $n_1 \approx n_A$). However, when the barrier layer is relatively thick and the quantum well layers are not in the bonding state, the refractive index ($n_2$) of the superlattice structure is larger than that ($n_A$) of the mixed crystal by about 0.1 over a wide range of wavelength (i.e., $n_A + 0.1 \leq n_2$). The fact is described in Journal of Electronic Materials, vol. 12, p. 397 (1983)).

Therefore, if an electric field is applied to the relatively thick barrier layer of the superlattice structure to change its potential distribution and hence effectively vary the height and the shape of the barrier's potential, the bonding state between quantum well layers will be changed. As a result, the refractive index of the superlattice structure will be greatly changed. That is, the refractive index is relatively small when the quantum well layers are in the bonding state, and is relatively large when they are not in the bonding state.

In the fourth embodiment, the refractive index of the semiconductor light waveguide having the superlattice structure to which a voltage is applied, is greatly varied without any increase of the absorption loss, based on the above-explained principle. Thus, the Bragg wavelength of the diffraction grating is changed, and the diffraction light emitted outside always enters a determined portion of the light detecting device even if the wavelength of the incident light on the light waveguide fluctuates. Here, the change of the refractive index is conducted neither by the current injection into the light waveguide nor by the increase of the light absorption near the quantum level energy due to the application of the electric field to the waveguide including the quantum well layer, but is conducted by the above-discussed principle utilizing the superlattice structure. Therefore, the changeable width of the Bragg wavelength of the diffraction grating is further improved to widen the width of the wavelength tracking, and the response characteristic at the time of changing the wavelength is also enhanced. Moreover, there are no drawbacks such that the light absorption loss is increased and that the refractive index can be changed solely for wavelengths near the absorption edge to limit a usable light to such wavelengths.

Figure 5:
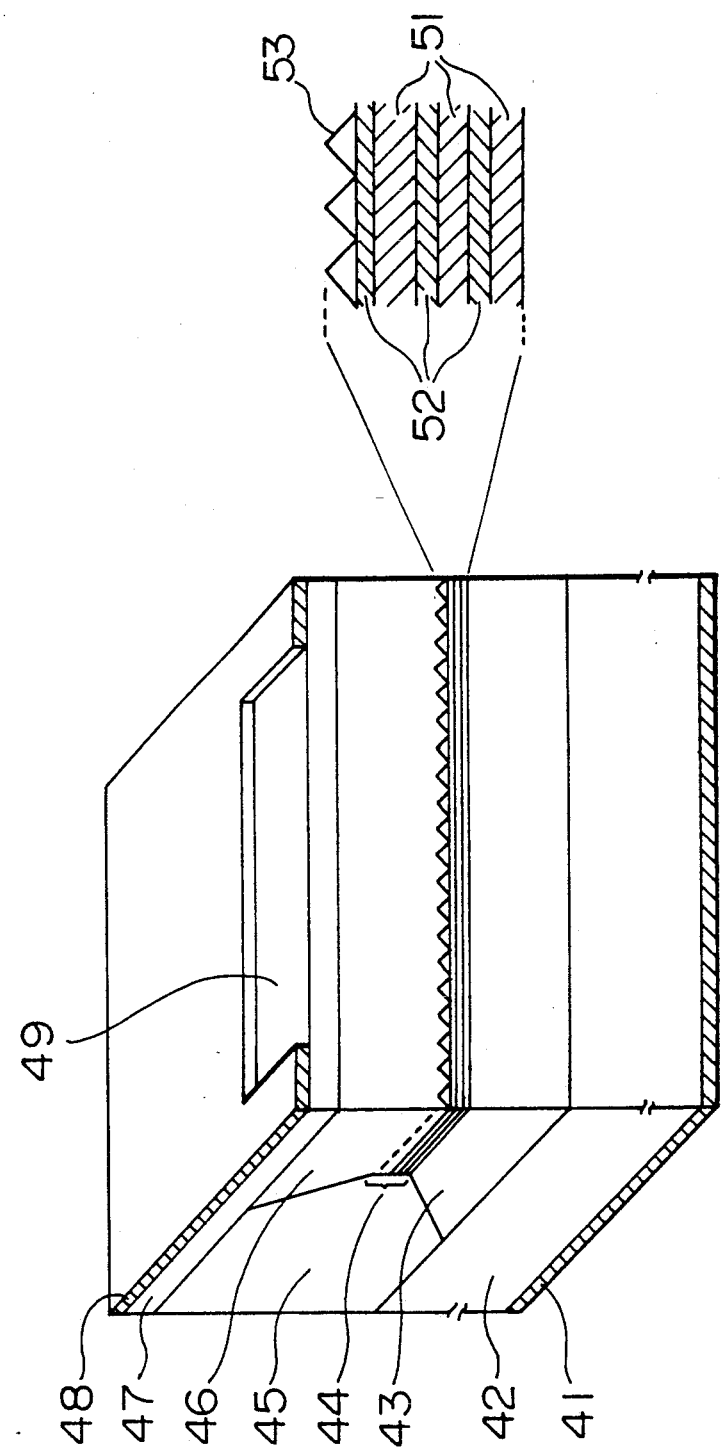
FIG. 5 is a partial cross-sectional view showing a portion of a fourth embodiment of a light detecting apparatus of the present invention having a light waveguide with a diffraction grating and a light detecting device.

The fourth embodiment of the present invention will be described by referring to FIG. 5. FIG. 5 shows a left half of the fourth embodiment of the light detecting apparatus as viewed from the light incident side. In FIG. 5, there are formed, on an n-GaAs substrate 42, an n-$Al_xGa_{1-x}$As cladding layer 43, a superlattice waveguide layer 44 in which ten n-GaAs well layers 51 (thickness thereof is 5 nm) and eleven high-resistance $Al_yGa_{1-y}$As layers 52 (thickness thereof is 6 nm; $0 \leq y < x < 1$) are alternately layered), a diffraction grating 53 having a pitch of about 260 nm, a p-$Al_xGa_{1-x}$As cladding layer 46 and a p-$Al_zGa_{1-z}$As contact layer 47 ($0 < z < 1$) in this order. A high-resistance $Al_xGa_{1-x}$As burying layer 45 is re-grown after the etching of both sides except for a stripe-shaped portion in order to achieve a confinement in a lateral direction. On the contact layer 47, there is formed an upper p-type electrode 48 in which a window 49 for emitting a diffraction light is formed, and on the bottom of the n-GaAs substrate 42, an n-type electrode 41 is formed.

In such a structure, the quantum well 51 is formed at a location within a light wavelength distance from the diffraction grating 53 and its thickness is no greater than the de Broglie wavelength. Furthermore, the array 11 of light detecting elements PD 1, 2 and 3 is disposed right above the window 49 for emitting the diffraction light from the waveguide, similar to the first embodiment.

In the above-discussed structure, the diffraction light is emitted above the waveguide when the incident light is input into the waveguide since the diffraction grating 53 is formed in the waveguide layer 44 or in the vicinity of the waveguide including the waveguide layer 44. At this time, the diffraction light is emitted in a direction perpendicular to the waveguide extension if the wavelength of the incident light is equal to the Bragg wavelength of the diffraction grating 53. Such a phenomenon is identical with that of the first embodiment.

In the fourth embodiment, a reverse bias voltage is applied to the superlattice waveguide layer 44, similar to the third embodiment. The Bragg wavelength of the diffraction grating 53 is 875 nm when no bias voltage is applied, and the absorption edge of the superlattice waveguide layer 44 is 820 nm. When a negative bias voltage of −5 V is applied through the electrode 48, the Bragg wavelength of the diffraction grating 53 decreases by about 10 nm. When no bias voltage is applied, the inclination of a potential distribution of the barrier layer 52 is small and the degree of bonding between the quantum wells 51 is small because the electric field applied to the barrier layer 52 consists only of a self-bias (that is due to the n-cladding layer 43 and p-cladding layer 46). Therefore, the refractive index of the superlattice waveguide is larger than that of the mixed crystal having the same Al mole fraction by about 0.1. On the other hand, when a negative bias voltage is applied, all the electric field is applied solely to the barrier layer 52 since the well layer 51 is n-type doped, and the inclination of the potential is made large. As a result, the height of the potential of the barrier layer 52 is effectively lowered, and the degree of bonding between the quantum well layers 51 increases. Thus, the refractive index becomes small, approaching a value of the mixed crystal of the same Al mole fraction. For all the change of the refractive index at this time, the optical loss in the light waveguide remains unchanged since the light absorption therein would not be increased.

Accordingly, the band range of the wavelength tracking of the light detecting apparatus having the wavelength tracking function and comprising the light waveguide with the diffraction grating 53 and the light detecting elements PD 1, 2 and 3 is expanded to 865~875 nm, compared with the changeable width of the Bragg wavelength (about several nanometers) caused by the plasma effect and the like resulting from by the current injection into the light waveguide. Furthermore, the response time at the time of changing the Bragg wavelength is highly improved to about 500 psec, compared with the case where carriers are injected (in this case, the response time is slow, such as several nsec, since time is required for the carrier injection), because no time is needed for injecting carriers into the light waveguide.

Figure 6:
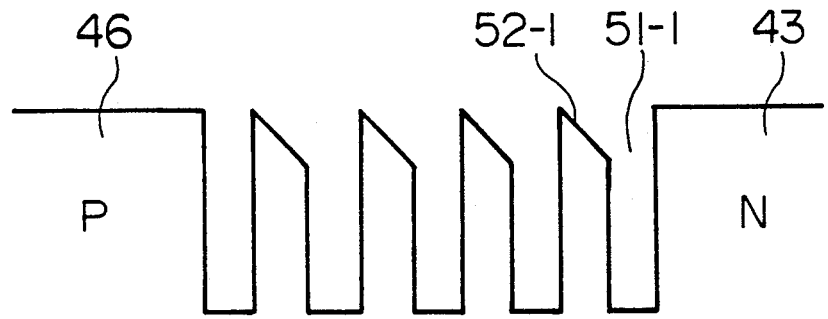
FIG. 6 is a schematic view of an energy band structure of a waveguide showing a inclining barrier potential.
Figure 7:
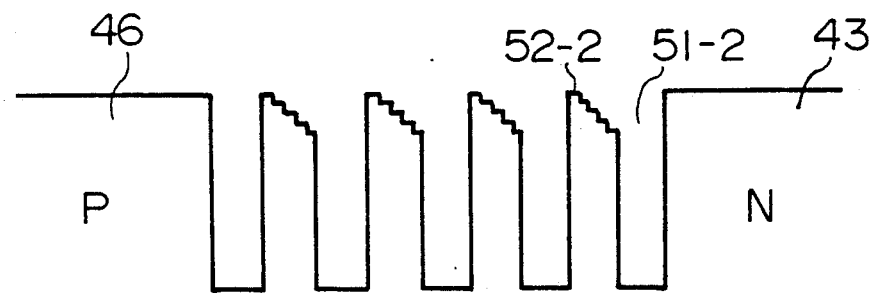
FIG. 7 is a schematic view of an energy band structure of a waveguide showing a stepwise inclining barrier potential.
Figure 8:
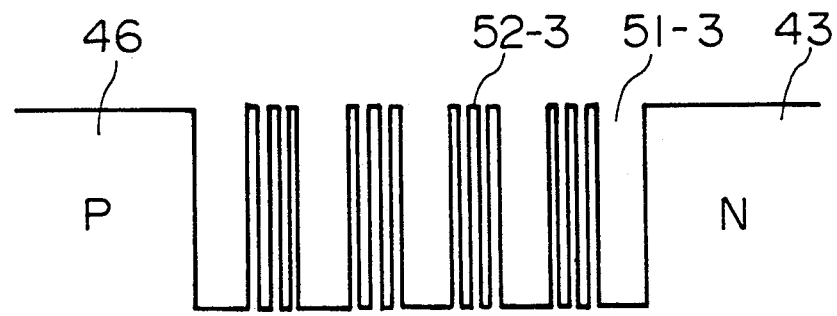
FIG. 8 is a schematic view of an energy band structure of a waveguide in which a barrier layer comprises a superlattice structure having a short period.

Several configurations of the potential distribution of the superlattice waveguide layers 51 and 52 are illustrated in FIGS. 6, 7 and 8. In FIG. 6, the superlattice waveguide layers 51-1 and 52-1 and the cladding layers 43 and 46 are formed such that the potential of the barrier layer 52-1 is inclined in a flat band state (non-bias voltage). In FIG. 7, the superlattice waveguide layers 51-2 and 52-2 and so forth are formed such that potential of the barrier layer 52-2 is stepwisely inclined in a flat band state (non-bias voltage). In FIG. 8, the barrier layer 52-3 is comprised of a superlattice having a short pitch. In these examples, the bonding between the quantum well layers 51-1, 51-2 and 51-3 is easily generated when the bias voltage is applied.

The operation of the fourth embodiment is substantially the same as that of the third embodiment. Detailed explanation will be made by referring to FIGS. 1 and 5. As an initial setting before starting the communication, the Bragg wavelength of the diffraction grating 53 is changed by controlling the applied voltage to the light waveguide so that a strongest region of the intensity distribution of the diffraction light of the incident light on the light waveguide enters a central element PD 2 of the array 11 of the light detecting elements. At this time, the incident lights on the other detecting elements PD 1 and PD 3 are set equal or to zero. In such a state, the communication will be started.

If the wavelength of the incident light varies to a longer value while such light is being received, the amount of received light on the detecting element PD 2 is decreased and at the same time the amount of received light on the detecting element PD 1 increases while that on the detecting element PD 3 decreases or remains unchanged at zero. Changes in amount and wavelength direction of the incident light can be known by calculating PD 1−PD 3 and PD 2−PD 1 (or PD 3) with a comparison means. Then, a voltage applying means is controlled by the comparison means to change the applied voltage to the light waveguide, so the Bragg wavelength of the diffraction grating 53 is increased. The strongest region of the diffraction light enters at the central detecting element PD 2 by making the incident lights on the detecting elements PD 1 and PD 3 equal to each other or equal to zero. On the other hand, when the wavelength of the incident light decreases and the amount of the incident light is changed reversely, the Bragg wavelength of the diffraction grating 53 is shifted to a shorter value by reversely changing the applied voltage to the light waveguide. Thus, the emission angle of the diffraction light is similarly controlled. Accordingly, even if the wavelength of the incident light changes, the diffraction light from the light waveguide is always incident on the central detecting element PD 2 of the light detecting element array 11 to perform the waveguide tracking of the incident light. Here, the relationship between the applied voltage and the Bragg wavelength of the diffraction grating has been measured prior to the communication and is stored in the voltage applying means.

Fifth embodiment

In the above-discussed embodiments, the current injection into or voltage application to the light waveguide with the diffraction grating is performed in order to make the Bragg wavelength of the diffraction grating close to the wavelength of the incident light. In these embodiments, however, it takes some time to tune the Bragg wavelength to the wavelength of the incident light if the the former differs greatly from the latter when the light detecting apparatus operation is started.

The fifth embodiment is constructed to resolve such problem. In this embodiment, a plurality of photodetectors for receiving the diffraction light emitted outside of the light waveguide include a photodetector having a light receiving surface whose length in the waveguide extension direction is short and a photodetector having a light receiving surface whose length in the same direction is long. Therefore, the incident light having a wavelength considerably remote from the Bragg wavelength of the diffraction grating can be detected, and hence a speedy wavelength tuning can be performed. Such a structure is also capable of simultaneously demultiplexing and detecting plural light signals of given wavelengths selected from the wavelength-multiplexed light signals.

Figure 9:
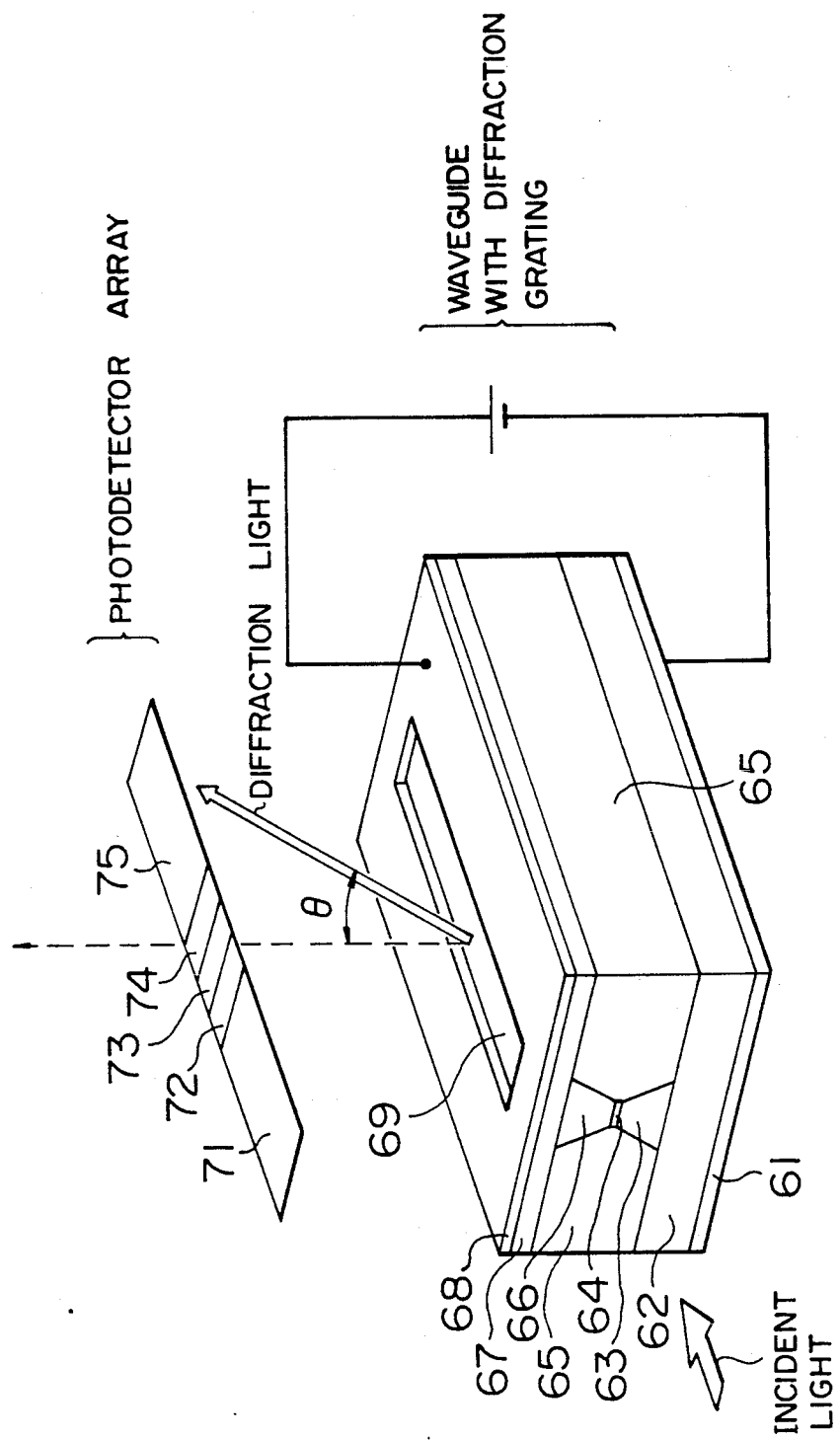
FIG. 9 is a perspective view of a fifth embodiment of a light detecting apparatus of the present invention having a light waveguide with a diffraction grating and a light detecting device.

The fifth embodiment of the present invention will be described by referring to FIG. 9. FIG. 9 shows an entire structure of the fifth embodiment. In FIG. 9, there are formed, on an n-GaAs substrate 62, an n−$Al_xGa_{1-x}As$ light confinement layer 63, an $Al_yGa_{1-y}As$ waveguide layer 64 ($0 \leq y < x < 1$), a high-resistance $Al_xGa_{1-x}As$ burying layer 65, a p−$Al_xGa_{1-x}As$ light confinement layer 66, and p-$Al_zGa_{1-x}As$ contact layer 67 ($0 < z < 1$) in this order.

On the contact layer 67, there is formed an upper p-type electrode 68 having a window 69 for emitting a diffraction light, and on the bottom of the n-GaAs substrate 62, an n-type electrode 61 is formed.

In such structure, the diffraction grating is formed in the $Al_yGa_{1-y}As$ waveguide layer 64 or at a location within a light wavelength distance from the waveguide including the waveguide layer 64. Furthermore, an array of five photodetectors 71~75 is disposed right above the window 69 for emitting the diffraction light from the waveguide, along the waveguide extension direction.

When the incident light enters the waveguide, the diffraction light is emitted by the diffraction grating above the light waveguide.

The far field pattern (FFP) of the diffraction light is, as explained above, very narrow in the direction of the waveguide extension and its span angle $\theta_p$ is about 0.2 degrees. In contrast, this pattern is wide in a direction transverse to the waveguide extension and its span angle $\theta_t$ is about 15 degrees. The relation between the change $\Delta\theta$ of the inclination or emission angle $\theta$ of the diffraction light from the perpendicular direction and the difference $\Delta\lambda$ between the wavelength of the incident light and the Bragg wavelength of the diffraction grating can approximately be represented by $\Delta\theta/\Delta\lambda \approx -0.3 \sim 0.4$ deg/nm. Therefore, the length of the light receiving surface in the waveguide extension direction should be about a beam diameter of the FFP in order to obtain the wavelength resolution of about 0.5 nm.

On the other hand, the emission angle becomes about 3 degrees when the wavelength of the incident light is away from the Bragg wavelength of the diffraction grating by 10 nm because the $\Delta\lambda$ dependency of the emission angle $\theta$ of the diffraction light remains almost unchanged in this region of the incident light wavelength. For example, where the distance between the photodetector array 71~75 and the waveguide is 10 mm, the length of the light receiving surface of the centrally disposed photodetectors 72, 73 and 74 in the waveguide extension direction need be less than 30 $\mu$m in order to obtain the wavelength resolution of about 0.5 nm. Further, the length of the light receiving surface of the photodetectors 71 and 75 disposed at ends of the array need be about 0.5 mm in order to also detect lights whose wavelengths are 10 nm away from the Bragg wavelength.

The change of the Bragg wavelength is performed by the current injection into or voltage application to the waveguide with the diffraction grating for increasing the effective refractive index. Therefore, the wavelength of the incident light should be set to a value shorter than the Bragg wavelength when there is no current injection or voltage application. The Bragg wavelength, however, can be increased if a Peltier element is added for controlling temperature, because the Bragg wavelength shifts to a longer value with the temperature dependency of about 0.07 nm/deg if the temperature of the light waveguide with the diffraction grating is raised.

Since the fifth embodiment has such structure, the difference of the wavelength between the incident light and the Bragg wavelength can be detected by the photodetectors 71 and 75 disposed at the ends even if the former is considerably distant from the latter. Thus, the wavelength tracking can be effectively achieved over a wider range. The operation is substantially the same as that of the first embodiment.

Sixth embodiment

Figure 10:
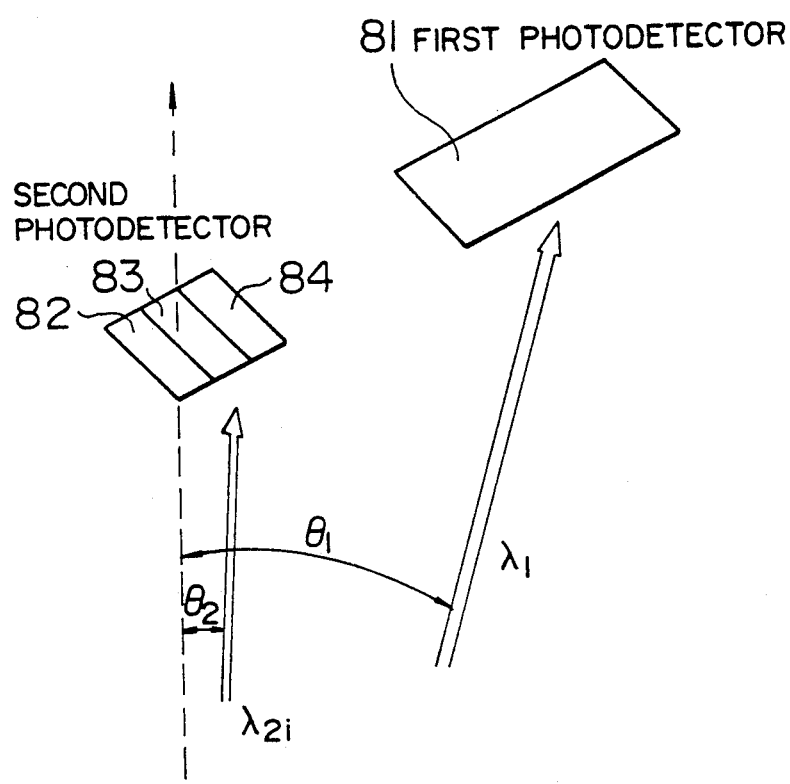
FIG. 10 is a view of a sixth embodiment of a light detecting apparatus of the present invention in which two selected light signals having different wavelengths are simultaneously detected from wavelength-multiplexed light signals.

FIG. 10 shows a structure of an array of photodetectors for demultiplexing and detecting light signals of two given wavelengths selected out of wavelength-multiplexed incident lights. The remaining structure thereof is identical with the fifth embodiment. The array of photodetectors comprises a first photodetector 81 having a light receiving surface whose length in the waveguide extension direction is relatively large and second photodetectors including a plurality of light detecting elements 82, 83 and 84 each having a light receiving surface whose length in the waveguide extension direction is relatively short. The second photodetectors 82~84 are disposed separately a little distant from the first photodetector 81. Here, the incident lights involve a plurality of signals of wavelengths $\lambda_1$ and $\lambda_{2i}$ (i=1.2, ..., n), and the signal of wavelength $\lambda_1$ is a control signal for the wavelength division multiplexing communication and hence should be always received at the receiver side. The band width of the control signal of wavelength $\lambda_1$ is wide, so the wavelength tracking is not needed for this signal. The wavelengths $\lambda_{2i}$ are sufficiently distant from the wavelength $\lambda_1$ and their band widths are narrow to increase the wavelength multiplicity. Therefore, the wavelength tracking is needed for the signals of wavelengths $\lambda_{2i}$.

When the above-mentioned light signals enter the waveguide with the diffraction grating, the light signal of wavelength $\lambda_1$ is always received by the first photodetector 81. On the other hand, the Bragg wavelength of the diffraction grating is regulated by the injection of current or application of voltage so that a determined signal of wavelength $\lambda_{2k}$ out of the light signals of wavelengths $\lambda_{2i}$ can be received by the second photodetectors 82~84. The wavelength tracking is performed by the second photodetectors 82~84 to continue the signal receiving. Such an operation is the same as that of the first embodiment.

The length and location of the light receiving surfaces of the photodetectors or light detecting elements are greatly dependent on characteristics of the diffraction grating, the distance between the waveguide and the photodetector array and the wavelengths of the input lights. Where the characteristics of the diffraction grating are substantially the same as those of the fifth embodiment, the difference between center wavelengths of $\lambda_1$ and $\lambda_{2i}$ is about 20 nm, the wavelength fluctuation of $\lambda_1$ is within a range of $\pm 1$ nm, the center wavelengths of $\lambda_{2i}$ are respectively 0.5 nm away from one another, the wavelength multiplicity is four and the distance between the waveguide and the photodetector array is 10 mm, the emission angle $\theta_1$ of the diffraction light of $\lambda_1$ differs from that $\theta_2$ of $\lambda_{2i}$ by about 6 degrees and the first photodetector 81 need detect the wavelength band width of $\lambda_1 \pm 2$ nm, i.e., (the wavelength fluctuation width) plus (the changeable width of the Bragg wavelength), in order to always receive the control signal of $\lambda_1$. The first photodetector 81 thus need detect light within a range of the emission angle from 5.4° to 6.6° measured from that of the lights of wavelengths $\lambda_{2i}$. Therefore, the first photodetector 81 needs to be disposed 1 mm distant from the second photodetectors 82~84 in the wavelength extension direction and the light receiving length of the first photodetector 81 needs to be no less than 0.2 mm in the same direction. On the other hand, the length of each light detecting element 82~84 need be about 10 $\mu$m since such detecting element should separately detect plural signals whose wavelengths are 0.5 nm distant from one another. In this structure, the emission angle of the control signal of wavelength $\lambda_1$ varies little when the wavelength tracking of the light signals of $\lambda_{2i}$ is conducted, but this variance of the emission angle of the control signal is no problem because the photodetector 81 has a sufficiently long light receiving surface in the waveguide extension direction.

Seventh embodiment

In the above-discussed embodiments, a plurality of photodetectors or light detecting elements are arranged in an array. In a case where the photodetectors are arranged in an array, however, light receiving surfaces thereof can not be continuously disposed since they are inevitably separated from one another by their surface electrodes and gaps therebetween. Therefore, there are limits to making the entire light detecting apparatus compact in size by decreasing the distance between the photodetector and the light waveguide and improving the wavelength resolution by reducing the length of the photodetector in the waveguide extension direction. In the seventh embodiment, a photodetectors are arranged in plural arrays and in such a manner that their light receiving surfaces are continuously disposed as a whole in the waveguide extension direction. As a result, the light detecting apparatus can be made compact in size and the wavelength resolution of the light detecting apparatus can be improved by decreasing the length of the light receiving surface in the waveguide extension direction.

Figure 11:
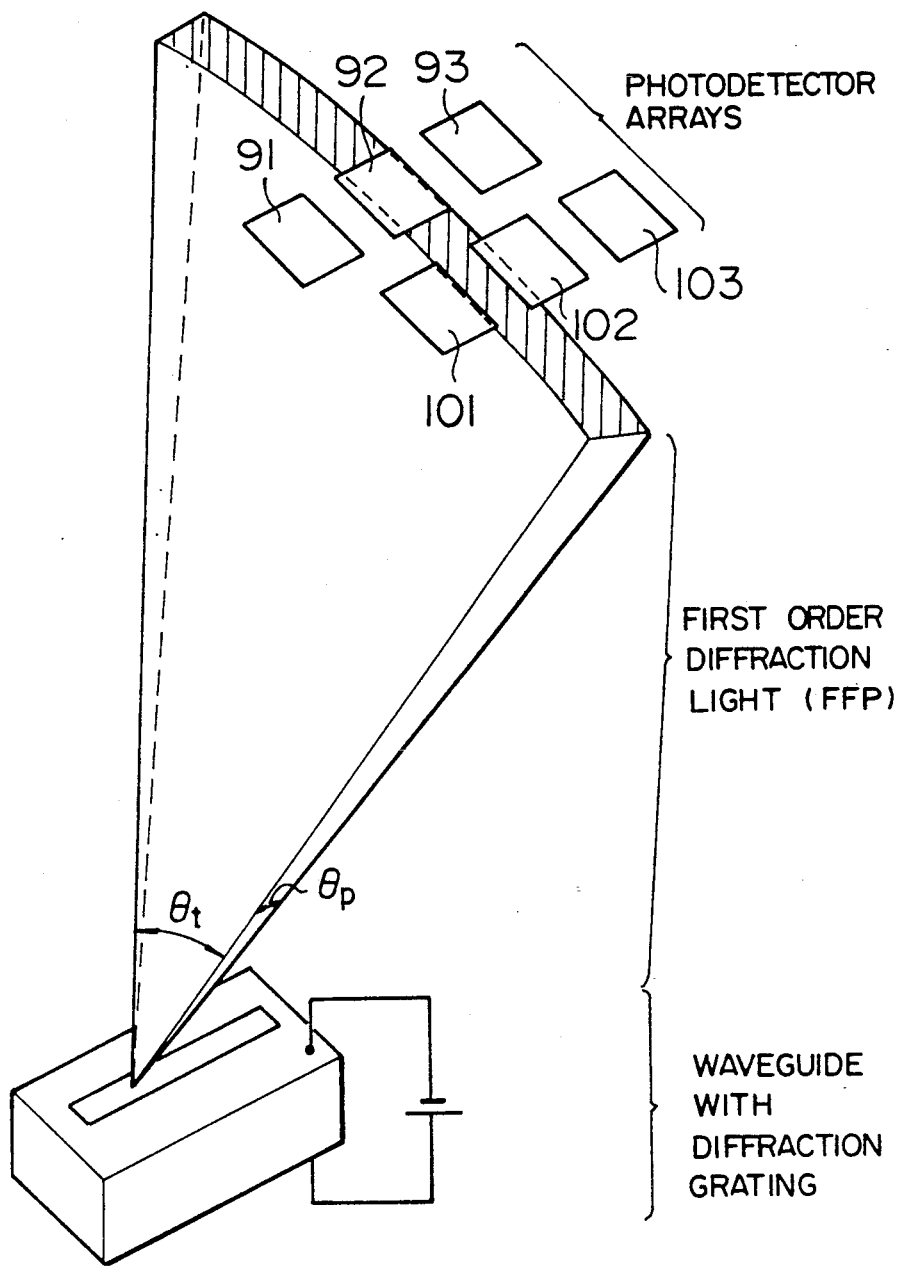
FIG. 11 is a view of a seventh embodiment of a light detecting apparatus of the present invention in which photodetectors are arranged in a zigzag or staggered manner.

FIG. 11 illustrates a schematic view of the seventh embodiment. A plurality of photodetectors are arranged in two arrays in the waveguide extension direction, and the two detector arrays are disposed in a staggered or zigzag manner to make the light receiving surfaces thereof continuous in the waveguide extension direction.

Light receiving surfaces 91, 92, 93; 101, 102, 103 of the photodetectors are respectively surrounded by portions (not shown) which do not detect light because the photodetectors and surface electrodes thereof must be electrically separated from each other. Therefore, the two arrays of the light receiving surfaces are arranged so as to compensate for those non-detecting portions.

The far field pattern (FFP) of the diffraction light emitted from the waveguide with the diffraction grating is, as explained above, very narrow in the direction of the waveguide extension and its span angle $\theta_p$ is approximately less than 0.2 degrees. In contrast, this pattern is wide in a direction transverse to the waveguide extension and its span angle $\theta_t$ is about 15 degrees. Therefore, an irradiation area (indicated by the hatching) of the diffraction light at the position of the photodetectors is short in the waveguide extension direction while long in the direction transverse thereto. Thus, the non-detecting portions in one array can be compensated for by the light receiving surfaces in the other array by arranging the two arrays of the photodetectors in the above-discussed manner.

On the other hand, the waveguide resolution of the detected light is determined by the span angle $\theta_p$ of the diffraction light in the waveguide extension direction, the relation between the change $\Delta\theta$ of the inclination or emission angle $\theta$ of the diffraction light from the perpendicular direction and the difference $\Delta\lambda$ between the wavelength of the incident light and the Bragg wavelength of the diffraction grating represented by $\Delta\theta/\Delta\lambda \approx -0.3 \sim -0.4$ deg/nm and the length of the light receiving surface of the photodetector in the waveguide extension direction.

As explained above, when the length of the light receiving surface in the waveguide extension direction is, for example, about a beam diameter of the diffraction light, a wavelength resolution of about 0.5 nm can be obtained. In this case, if the distance between the waveguide and the photodetectors is 10 mm, the length of an effective light receiving surface becomes about 30 $\mu$m. Here, if a dead space exists between the light receiving surfaces, the wavelength resolution is lowered by that much. Since the ratio of the dead space becomes large as the length of the effective light receiving surface shortened, the seventh embodiment for compensating for the dead space is still effective as such ratio becomes large. Furthermore, if the length of the light receiving surface is reduced to about a third, the resolution can be improved two to three times since the beam intensity distribution of the diffraction light can be detected. Alternatively, the entire apparatus can be made compact in size by shortening the distance between the waveguide and the photodetectors if the resolution need not be further improved.

The span angle $\theta_p$ of the FFP of the diffraction light in the waveguide extension direction is about 0.2 degrees presently, but this angle can be made no greater than 0.1 degrees by optimizing the shape of the diffraction grating, optical loss and length of the light waveguide and so forth. Therefore, in the seventh embodiment, the resolution can be improved to less than 0.1 nm.

In the seventh embodiment, the change of wavelength of the incident light and its direction can be obtained by, for example, detecting the amount of the received light on each photodetector. Based on the detected result, the wavelength tracking can be performed by appropriately shifting the Bragg wavelength of the diffraction grating. In other respects the seventh embodiment is the same as the above-discussed embodiments.

Eighth embodiment

In the light detecting apparatus having the wavelength tracking function of the first embodiment, etc., there are provided the semiconductor light waveguide having the diffraction grating, the electrode for the current injection or voltage application, a plurality of photodetectors disposed for receiving the diffraction light emitted outside of the waveguide, and the control device for changing the Bragg wavelength of the waveguide by injected current or applied voltage so that the diffraction light is always incident on a determined photodetector, based on the information of the change in the emission angle of the diffraction light due to the wavelength fluctuation of the incident light on the waveguide which is detected by the plural photodetectors.

In those embodiments, however, the detection sensitivity will be reduced because the intensity of the diffraction light becomes small, if the intensity of the incident light is small. Therefore, the detection sensitivity of the apparatus is greatly improved by adding an optical amplification function to the light waveguide of the eighth embodiment.

Figure 12:
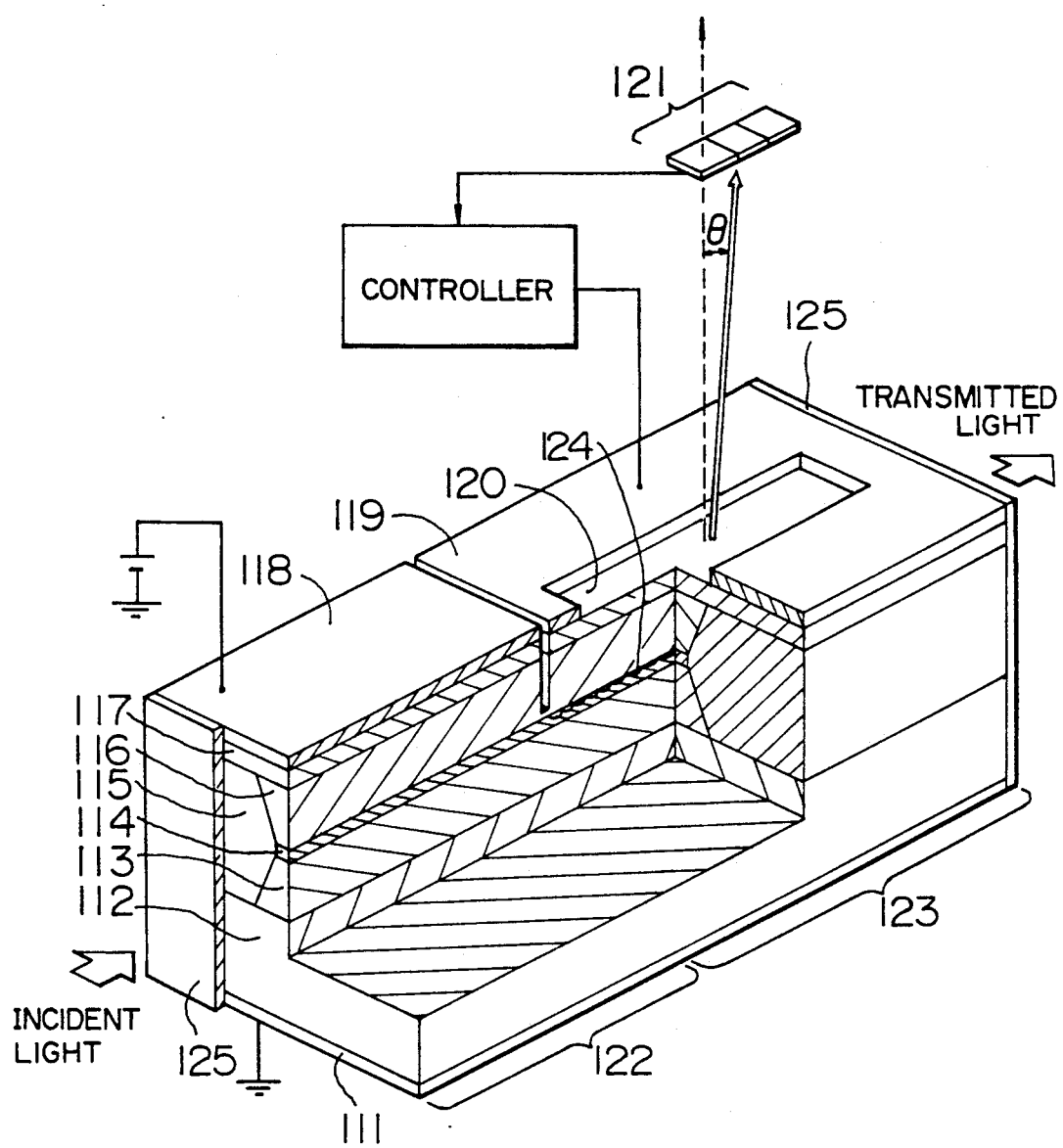
FIG. 12 is a view of an eighth embodiment of a light detecting apparatus of the present invention having an optical amplifier portion.

The eighth embodiment of the present invention will be described by referring to FIG. 12 which is a partly broken perspective view. In FIG. 12, there are provided a light waveguide part 123 with a diffraction grating, an optical amplifier part 122 and an array 121 of light detecting elements. In the light waveguide part 123 with the diffraction grating and the optical amplifier part 122, there are formed, on an n-GaAs substrate 112, an n-$Al_xGa_{1-x}As$ light confinement layer 113, an $Al_yGa_{1-y}As$ light waveguide layer 114 ($0 \leq y < x < 1$) a high-resistance $Al_xGa_{1-x}As$ burying layer 115, a p-$Al_xGa_{1-x}As$ light confinement layer 116, and a p-$Al_zGa_{1-z}As$ contact layer 117 ($0 < z < 1$). On the bottom of the n-type substrate 112, there is formed an n-type electrode 111. Furthermore, on the light waveguide part 123, an upper p-type electrode 119 having a window 120 for emitting a diffraction light is formed, and on the optical amplifier part 122, an upper p-type electrode 118 is formed.

In such a structure, a diffraction grating 124 is formed in the $Al_yGa_{1-y}As$ light waveguide layer 114 or at a location within a light wavelength distance from the light waveguide including the waveguide layer 114. Furthermore, an array of three light detecting elements 121 is disposed right above the window 120 for emitting diffraction light from the waveguide, and anti-reflection coatings 125 are deposited on both opposite end surfaces of the waveguide.

Next, a operation of the eighth embodiment will be explained. In the state in which a current below an oscillation threshold is injected through the electrode 118, the incident light through the anti-reflection coating 125 is amplified by the optical amplifier part 122, and the diffraction light is emitted above the waveguide by the diffraction grating 124. At this time, the intensity of the emitted diffraction light can be made stronger than that in the above-discussed embodiments by the optical amplifier part 122. Although a spontaneous emission light is added while the signal light is amplified, only a component of the overlapped spontaneous emission light having the same wavelength as that of the signal light becomes a noize since each light detecting element detects the signal light demultiplexed to respective wavelength components by the diffraction grating. Therefore, the S/N ratio can be greatly improved irrespective of the overlap of the spontaneous emission light.

The structure of the waveguide in the optical amplifier part 122 is identical with that in the light waveguide part 123, so the fabrication is easily performed. There is no need to align the optical axes between the amplifier part 122 and the waveguide part 123, so the coupling loss need not be considered. As regards the way how to perform the wavelength tracking and so forth, they are the same as those of the first embodiment.

Ninth embodiment

Figure 13:
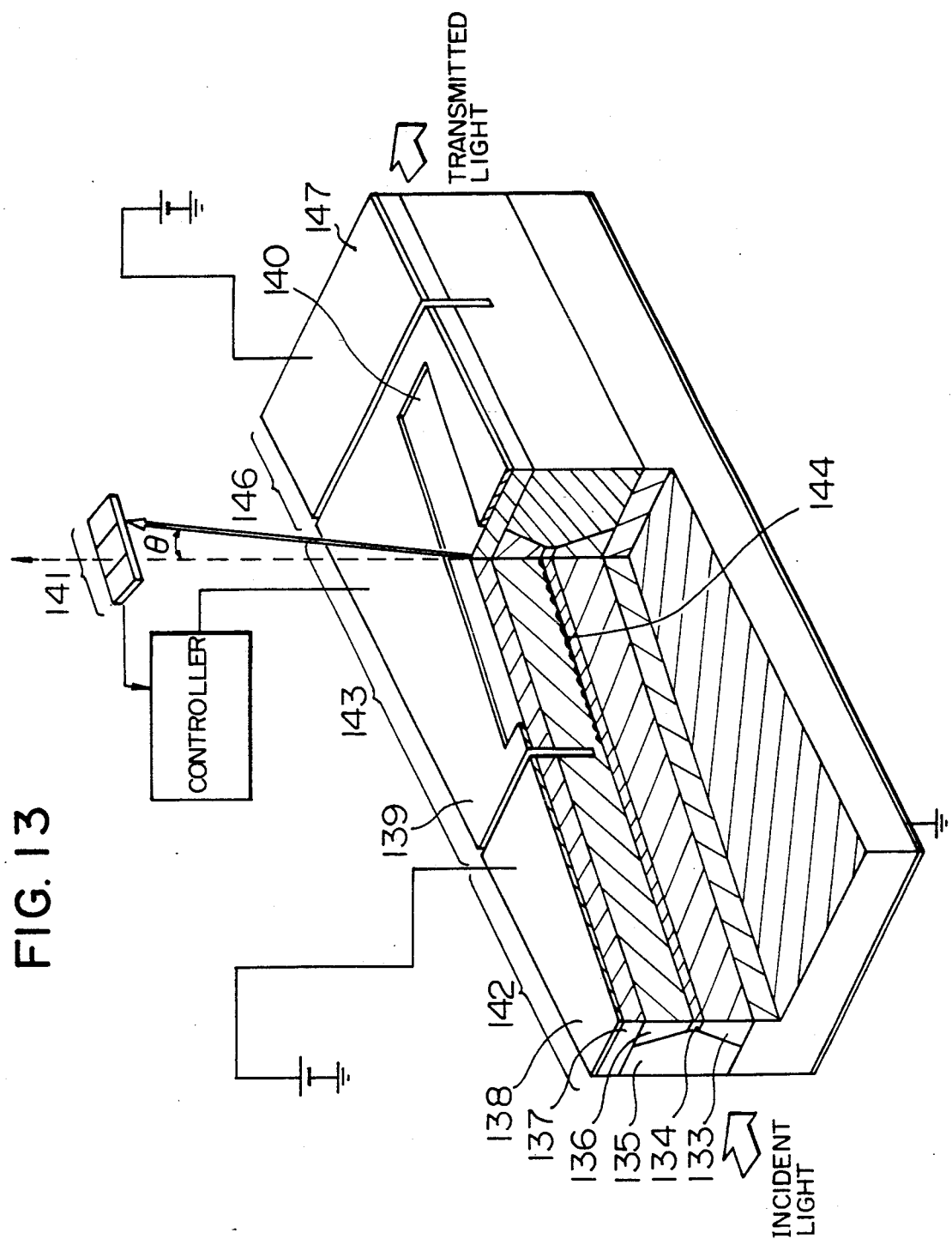
FIG. 13 is a view of a ninth embodiment of a light detecting apparatus of the present invention having an optical amplifier portion.

FIG. 13 shows the structure of the ninth embodiment of the present invention. FIG. 13 is a partly broken perspective view. In FIG. 13, there are provided a light waveguide part 143 with a diffraction grating, a first optical amplifier part 142, a second optical amplifier part 146 and an array 141 of light detecting elements. In the light waveguide part 143 with the diffraction grating and the first and second optical amplifier parts 142 and 146, there are formed, on an n-GaAs substrate 132, an n-$Al_xGa_{1-x}As$ light confinement layer 133, an $Al_yGa_{1-y}As$ light waveguide layer 134 ($0 \leq y < x < 1$) a high-resistance $Al_xGa_{1-x}As$ burying layer 135, a p-$Al_xGa_{1-x}As$ light confinement layer 136 and a p-$Al_zGa_{1-z}As$ contact layer 137 ($0 < z < 1$). The extension direction of the waveguide is set to form a non-zero predetermined angle relative to a nomal to the end surface of the substrate 132. On the bottom of the n-type substrate 132, there is formed an n-type electrode 131. Further, on the light waveguide part 143, an upper p-type electrode 139 having a window 140 for emitting a diffraction light is formed, and on the first and second optical amplifier parts 142 and 146, upper p-type electrodes 138 and 147 are respectively formed.

In such a structure, a diffraction grating 144 is formed in the $Al_yGa_{1-y}As$ light waveguide layer 134 or at a location within a light wavelength distance from the light waveguide including the waveguide layer 134. Furthermore, an array 141 of three light detecting elements is disposed above the window 140 for emitting the diffraction light from the waveguide.

Next, the operation of the ninth embodiment will be explained. Since the waveguide extension direction is set to form a non-perpendicular predetermined angle relative to the end surface of the waveguide, the reflection at the end surface is s pressed and hence the oscillation threshold current in the optical amplifier part 142 can be made large. In the state in which a current below the oscillation threshold is injected through the electrode 138, the incident light through the end surface is amplified by the optical amplifier part 142, and the diffraction light is emitted above the waveguide by the diffraction grating 144. At this time, the intensity of the emitted diffraction light can be made stronger than that of the first embodiment and so forth by the first optical amplifier part 142. Although a spontaneous emission light is added while the signal light is amplified, the S/N ratio can be greatly improved since the light detection is performed after a signal light is demultiplexed to respective wavelength components.

Furthermore, the loss of the transmitted light created by the grating 144 can be compensated for by the second optical amplifier part 146 and transmitted light having the same intensity as the incident light can be obtained. The structures of the waveguides in the optical amplifier parts 142 and 146 are identical with those in the light waveguide part 143, similar to the eighth embodiment, so the fabrication is easily effected. There is also no need to align the optical axes between the amplifier parts 142 and 146 and the waveguide part 143, so the coupling loss need not be considered. With regard to performing the wavelength tracking and so forth, they are the same as those of the first embodiment.

Tenth embodiment

Figure 14:
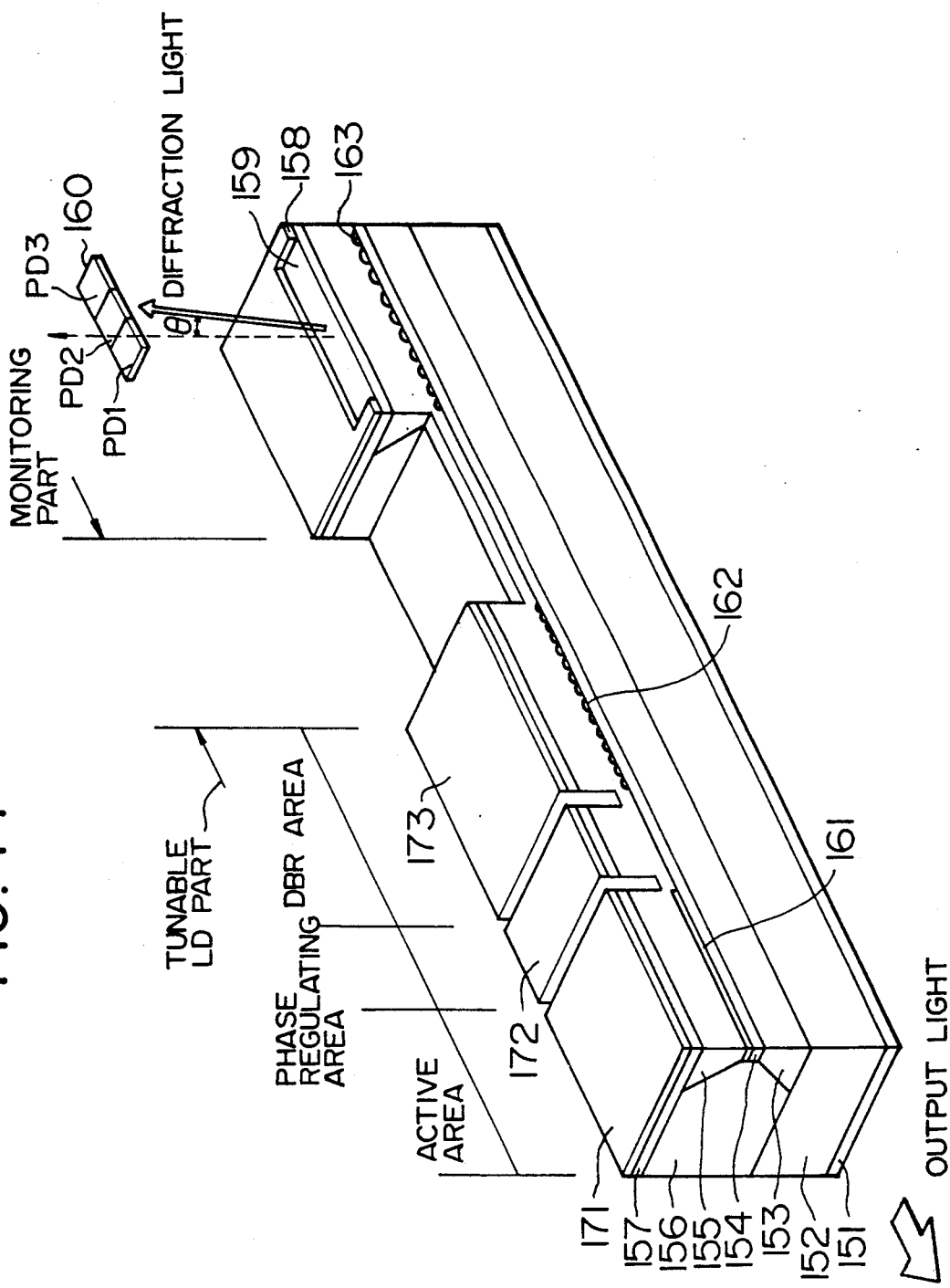
FIG. 14 is a view of a tenth embodiment of the present invention in which a tunable semiconductor laser part and a waveguide portion of a monitoring part for monitoring oscillation wavelength and output power of the laser are monolithically formed.

FIG. 14 shows the structure of the tenth embodiment of the present invention in which a three-electrode distributed Bragg reflection (DBR) type tunable semiconductor laser part and a waveguide portion of a monitoring part for detecting wavelength and output power are monolithically formed. In FIG. 14 showing a left half structure of the tenth embodiment, there are formed on an n−GaAs substrate 152, an n−$Al_xGa_{1-x}As$ light confinement layer 153, an $Al_yGa_{1-y}As$ light waveguide layer 154 ($0 \leq y < x < 1$; the energy gap of the light confinement layer 153 is larger than that of the light waveguide layer 154, and the refractive index of the layer 153 is smaller than that of the layer 154 to perform the light confinement function), a p−$Al_xGa_{1-x}As$ light confinement layer 155 and a p−$Al_zGa_{1-z}As$ contact layer 157 ($0 < z < 1$) in that order. The mole fraction z of Al of the contact layer 157 is selected so that the light absorption is small for the oscillation wavelength. A high-resistance $Al_xGa_{1-x}As$ burying layer 156 is re-grown after etching both sides except for a stripe-shaped portion in order to achieve confinement in a lateral direction.

On the contact layer 157, there are formed upper p-type electrodes 158, 171, 172 and 173. The electrode 158 in the monitoring part has a window 159 for emitting diffraction light. On the bottom of the n-GaAs substrate 152, an n-type electrode 151 is formed. In the $Al_yGa_{1-y}As$ light waveguide layer 154, there are formed, at a location within a light wavelength distance from the waveguide including the waveguide layer 154, an active layer 161 in the active area of the laser part, a diffraction grating 162 for a distributed reflection mirror in the DBR area and a diffraction grating 163. The phase regulating area is formed between the active area and the DBR area. Furthermore, an array 160 of three light detecting elements PD 1, 2 and 3 is disposed above the window 159 for emitting the diffraction light from the waveguide.

In the above-discussed structure, when the tunable semiconductor laser oscillates, the laser light enters the waveguide in the monitoring prat. Diffraction light is emitted above the waveguide when the light is input into the waveguide since the diffraction grating 163 is formed in the monitoring part for the incident light. At this time, the diffraction light is emitted in a direction perpendicular to the waveguide if the wavelength of the incident light is equal to the Bragg wavelength of the diffraction grating 163. The situation is the same as that of the first embodiment.

Figure 15:
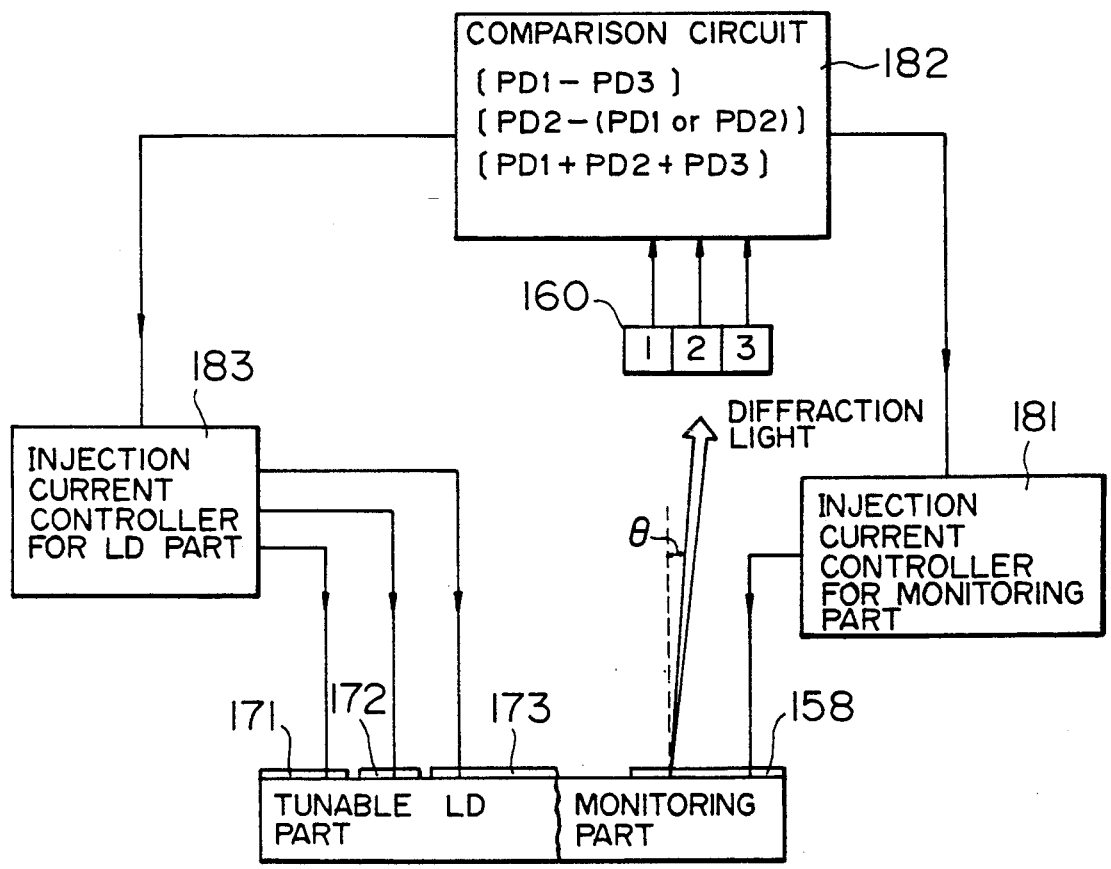
FIG. 15 is a block diagram of a structure for controlling the tenth embodiment.

FIG. 15 shows a block diagram of the light detecting apparatus for the semiconductor laser apparatus of FIG. 14 having a wavelength and output power monitoring function. The structure in FIG. 15 is basically the same as that in FIG. 2. In the FIG. 15, as an initial setting before the start of communication, the tunable laser oscillates and the Bragg wavelength of the diffraction grating 163 is changed by controlling the injection current into the light waveguide by an injection current control circuit 181 for the monitoring part so that the strongest region of the intensity distribution of the diffraction light of the incident light on the monitoring part is incident on a central element PD 2 of the array 160 of the light detecting elements. At this time, incident lights on the other detecting elements PD 1 and PD 3 are set equal or to zero.

Unless the oscillation wavelength and the output power (a signal of the PD 2 or an entire signal of the PD 1, 2 and 3) respectively reach desired values, the above operation is repeated until the desired values are obtained. In such a state, the communication will be started.

If the wavelength of the incident light increases while such light is being transmitted, the received light on the detecting element PD 2 is decreased and at the same time the received light on the detecting element PD 1 increases while that on the detecting element PD 3 decreases or remains unchanged at zero. Changes in the amount and the wavelength of the incident light can be known by calculating PD 1-PD 3 and PD 2-PD 1 (or PD 3) by a comparison circuit 182. An injection current control circuit 183 is then controlled by the comparison circuit 182 to vary the injection currents into the light waveguide through the electrodes 171, 172 and 173 (especially, the electrode 173), so the oscillation wavelength of the semiconductor laser is decreased. The strongest region of the diffraction light is thus caused to enter the central detecting element PD 2 again. The output power is maintained constant by controlling the injection currents through the electrodes 171, 172 and 173 (especially, the electrode 171) of the semiconductor laser so that the sum of outputs of the elements PD 1, 2 and 3 remains unchanged. As a result, the oscillation wavelength and the output power can always be maintained at the desired values. Thus, an increase of wavelength multiplicity in the wavelength division multiplexing communication becomes possible. In this embodiment, when the diffraction grating 162 used in the DBR area of the laser part has a second order, the pitch of the grating 162 is equal to that of the diffraction grating 163 of the monitoring part and hence the fabrication of the apparatus becomes easier.

If the wavelength of the incident light from the tunable LD part decreases, the control is conducted in a reverse manner.

Eleventh embodiment

Figure 16:
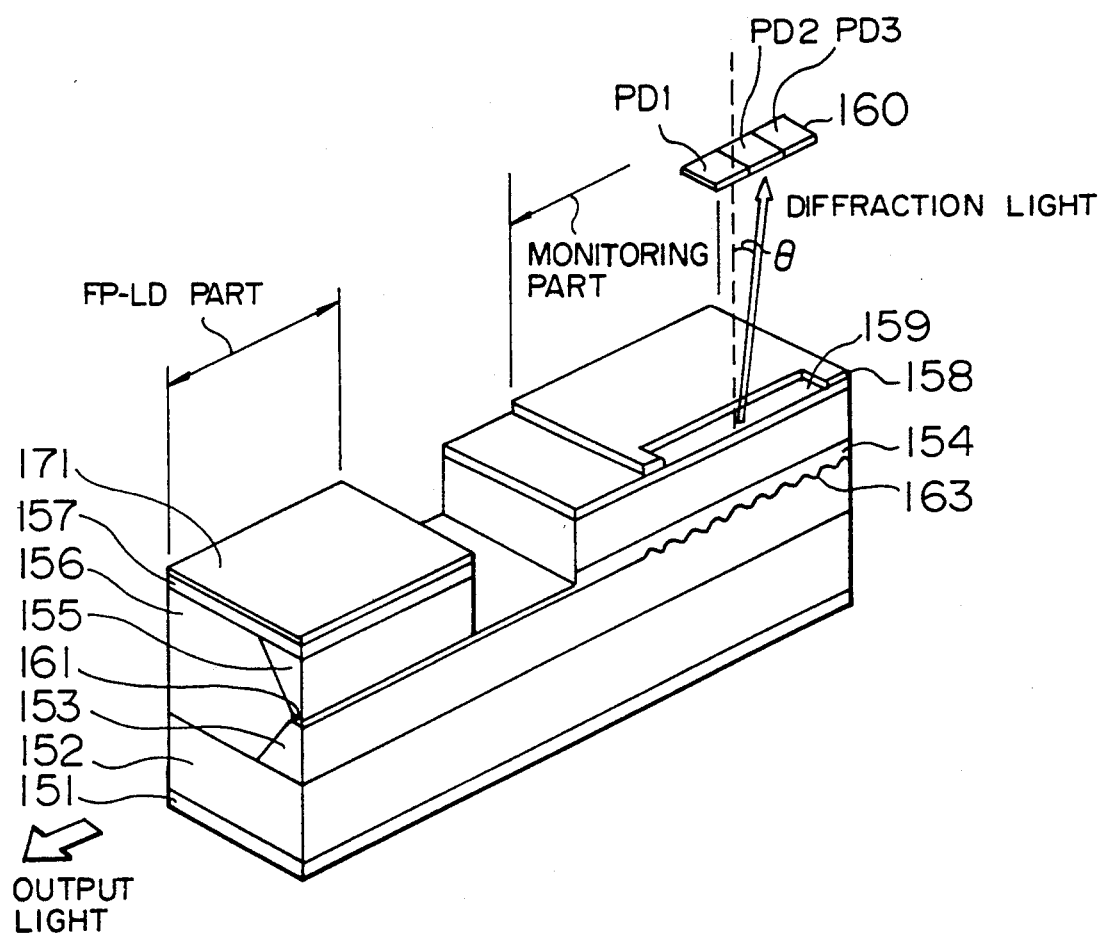
FIG. 16 is a view of an eleventh embodiment of the present invention in which a Fabry-Perot semiconductor laser and a waveguide portion of a monitoring part for monitoring oscillation wavelength and output power of the laser are monolithically formed.

FIG. 16 shows a structure of the eleventh embodiment of the present invention in which a Fabry-Perot type semiconductor laser (FP-LD) part and a waveguide portion of a monitoring part for detecting wavelength and output power are monolithically formed. Portions having the same functions as those in FIG. 14 are designated by the same reference numerals. The resonator of the FP-LD part is formed by a cleaved surface at the light output side and a mirror surface produced by etching at the monitoring part side. Part of the transmitted light through the mirror surface formed by the etching enters the waveguide in the monitoring part.

Figure 17:
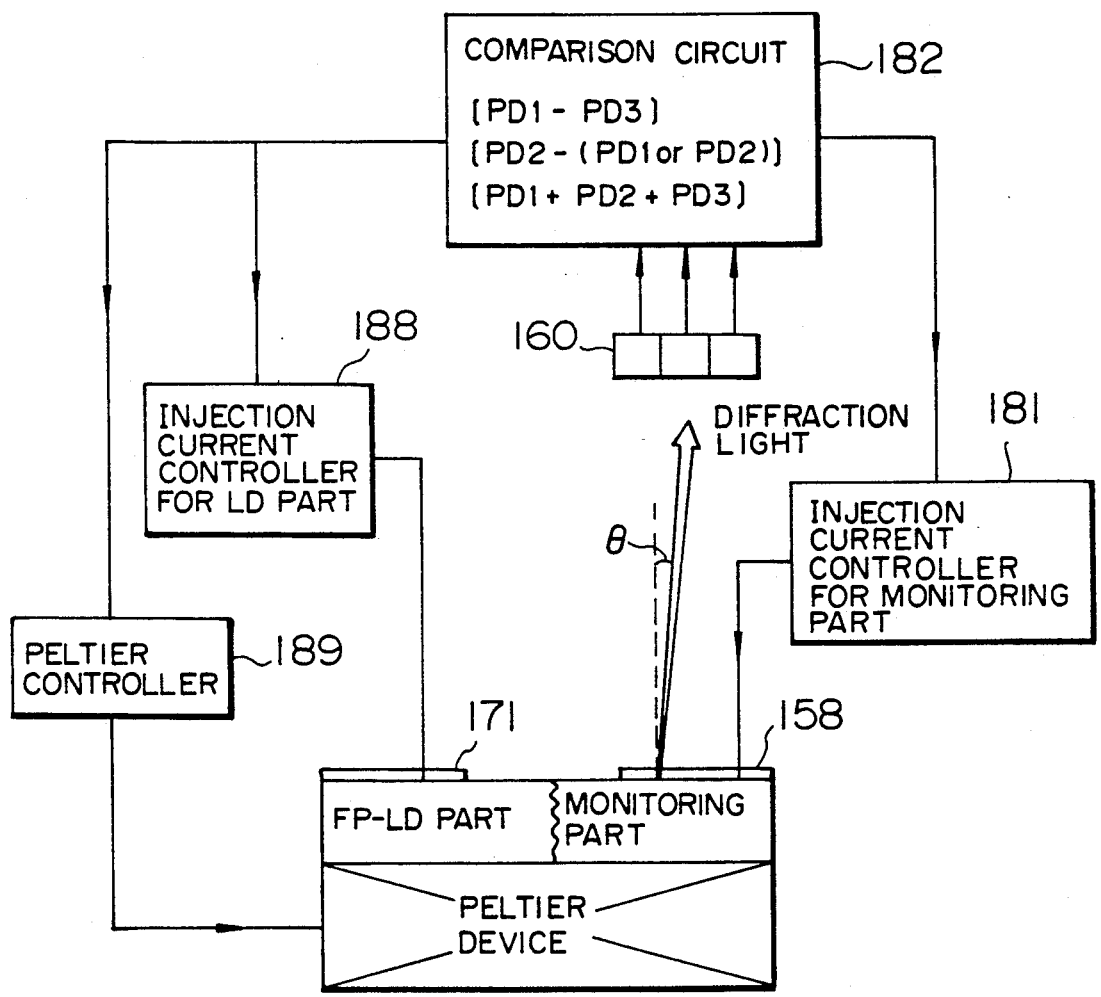
FIG. 17 is a block diagram of a structure for controlling the eleventh embodiment.

FIG. 17 shows a block diagram of the light detecting apparatus for the semiconductor laser apparatus of FIG. 16 having wavelength and output power monitoring functions. Portions having the same functions as those in FIG. 15 are designated by the same reference numerals. The control of the output power from the FP-LD part is effected through the control of the injection current through the electrode 171 by a injection current control circuit 188 for the laser part, and the control of the oscillation wavelength is performed by the control of a temperature of the FP-LD part through a Peltier device 190 caused by a Peltier control circuit 189. The temperature dependency of the oscillation wavelength from the FP-LD part is relatively large, such as 0.3 nm/deg, so this apparatus can be used for a wide range of the oscillation wavelength. The Peltier device 190 includes two portions which respective function for the monitoring part and the FP-LD part.

While the semiconductor laser part and the waveguide in the monitoring part are monolithically formed in the tenth and eleventh embodiments, it is possible to form these parts separately and couple the waveguides thereof by a lens, a fiber or the like. Furthermore, as a semiconductor laser unit, non-tunable distributed feedback type and distributed Bragg reflection type lasers can be also used.

Twelfth embodiment

Figure 18:
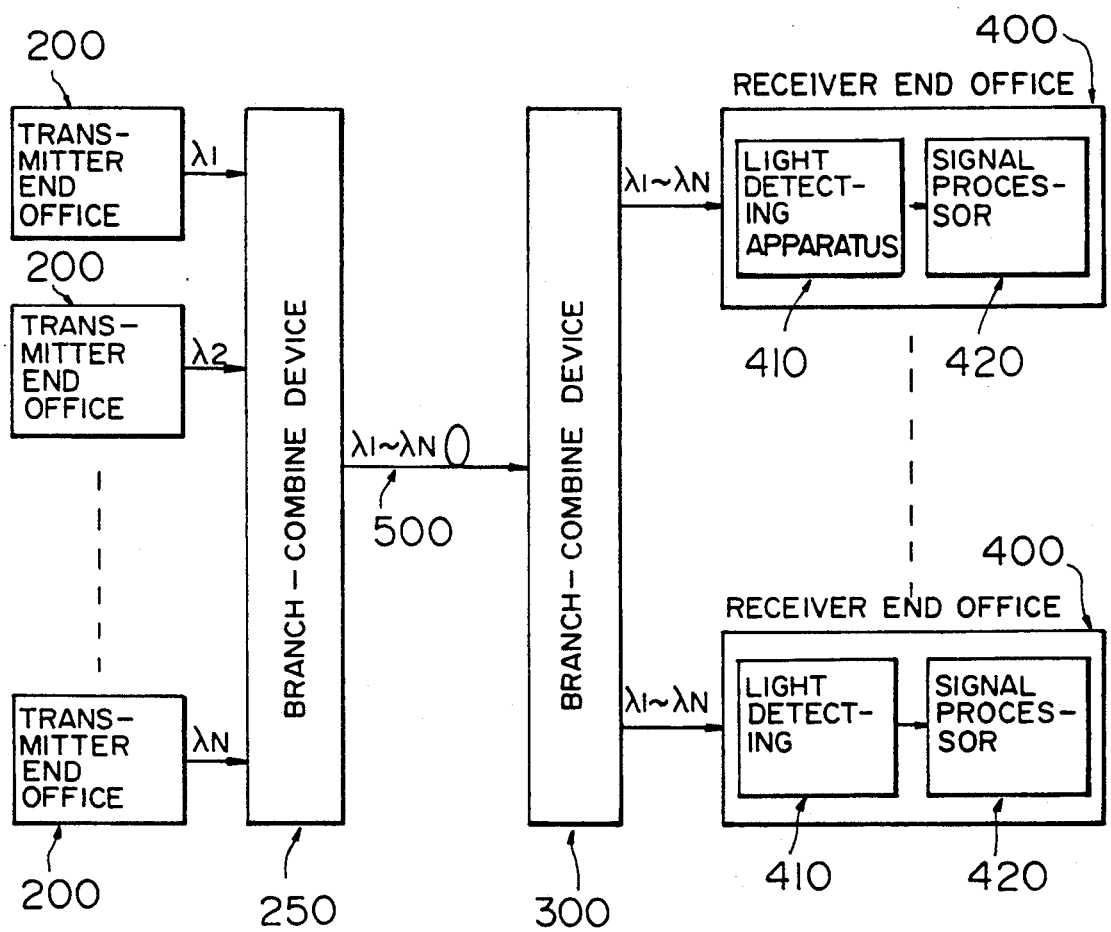
FIG. 18 is a view of a twelfth embodiment of the present invention in which the light detecting apparatus of the present invention is used in an optical communication system.

FIG. 18 shows the twelfth embodiment of the present invention of an optical communication system including the light detecting apparatus of the present invention. In FIG. 18, reference numerals 200 designate transmitter end office terminals, reference numerals 250 and 300 designate branching-combining devices, reference numerals 400 designate receiver end offices or terminals and reference numeral 500 designates a light transmission line such as an optical fiber and the like. The transmitter end offices 200 respectively comprise a signal processing part, and a light transmitter part including an electro-optical conversion portion which is a light detecting apparatus provided with a semiconductor laser of, for example, the tenth embodiment and so forth. The receiver end offices are respectively composed of a light detecting apparatus 410 such as that of the first embodiment, a signal processing part or processor 420 and so forth.

In the optical communication system of FIG. 18, the N number of the transmitter end offices 200 respectively transmit light signals of different wavelengths $\lambda_1, \ldots, \lambda_N$, and these signals are wavelength-multiplexed at the branching-combining device 250 to be transmitted to the transmission line 500. The light signals transmitted through the transmission line 500 are branched into the M number of lights by the branching-combining device 300, and they are input into the M number of the receiver end offices 400. In the receiver end office 400, the light detecting apparatus 410 is controlled to select the signal of a desired wavelength from the multiplexed light signals of the N number of wavelengths, and the selected signal is converted into an electric signal. This electric signal is further processed in the signal processing part 420, and the communication from the transmitter end office 200 to the receiver end office 400 is completed.

In the twelfth embodiment, signals are transmitted from plural transmitter end offices to plural receiver end offices in a uni-directional manner, but the following constructions are also possible: ①The branching-combining device 300 may be omitted and only one receiver end office may be disposed. ② Plural transmitter end offices and at least one receiver end office may be respectively connected to the branching-combining devices 250 and 300 to conduct a bi-directional communication. ③ Transmitter and receiver end offices may be connected to the optical transmission line through the branching-combining devices and the like in a bus type or in a loop type, or through a star type coupler and the like.

In these constructions, communication similar to one noted above is possible only if the plural transmitter end offices (or transmitter parts) for transmitting light signals of different wavelengths and at least one receiver end offices (or receiver parts) containing the light detecting apparatus of the above-discussed embodiment are connected in a network fashion.

As explained in the foregoing, in the structure of the first aspect of the present invention, the light detecting device is located at a position capable of receiving the diffraction light emitted outside of the waveguide with the diffraction grating, and when, for example, the Bragg wavelength of the waveguide is changed based on the detected information by the control of the current injected into or the voltage applied to the waveguide so that the diffraction light is always incident on a determined portion of the light detecting device, wavelength tracking of the incident light is achieved.

In the structure of the second aspect of the present invention, the light detecting device is located at a position capable of receiving the diffraction light emitted outside of the semiconductor waveguide with the diffraction grating using the quantum well structure containing at least one well layer. When, for example, the Bragg wavelength of the waveguide is changed based on the detected information by the control of the voltage applied to the waveguide so that the diffraction light is always incident on a determined portion of the light detecting device, the wavelength tracking of the incident light can be achieved over a wide wavelength band width. As a result, a response characteristic at the time of the wavelength change is improved.

In the structure of the third aspect of the present invention, the light detecting device is located at a position capable of receiving the diffraction light emitted outside of the semiconductor waveguide with the diffraction grating using the superlattice structure containing at least two well layers and the barrier layer therebetween. When, for example, the bonding state between the well layers is changed by the control of the voltage applied to the barrier layer in the waveguide to vary the refractive index and the Bragg wavelength of the waveguide is changed over an expanded range so that the diffraction light is always incident on a determined portion of the light detecting device, the wavelength tracking of the incident light can be achieved over a wide wavelength tracking width. Here, the optical loss in the light waveguide is not increased and the response characteristic at the time of wavelength change is improved.

In the structure of the fourth aspect of the present invention, the array of photodetectors includes a photodetector having a longer light receiving surface in the direction of the waveguide extension disposed at the ends of the array continuously or separately. Such a structure can perform a rapid wavelength tuning and simultaneous demultiplexing and detection of plural light signals of selected wavelengths out of wavelength-multiplexed signal lights.

In the structure of the fifth aspect of the present invention, a plurality of arrays of photodetectors in the direction of the waveguide extension are arranged such that light receiving surfaces of the photodetectors are continuously extended in the same direction as a whole, so that wavelength resolution of the light detecting apparatus can be improved and more accurate wavelength tracking becomes possible.

In the structure of the sixth aspect of the present invention, part of the light waveguide with the diffraction grating is constructed as an optical amplifier part, so that the intensity of the diffraction light is strengthened and a transmitted light is not attenuated greatly. Further, compared to a case where separate devices having the same functions are combined, the fabrication step can be facilitated and the light loss can be suppressed.

In the structure of the seventh aspect of the present invention, the light detecting device is located at a position capable of receiving the diffraction light emitted outside of the semiconductor waveguide with the diffraction grating and the wavelength and/or output power of a semiconductor laser is monitored, so that the wavelength and/or output power can be always maintained constant by feeding back the detected signal to the semiconductor laser.

In the structure of an optical communication network the present invention, the light detecting apparatus for the semiconductor laser is contained in a transmitter end office or terminal or the light detecting apparatus is contained in a receiver end office or terminal, so that the wavelength multiplicity of the wavelength division multiplexing communication can be increased since wavelengths of respective signals may be closer to one another.

While the present invention has been described with respect to what is presently considered to be preferred embodiments, it is understood that the invention is not limited to the disclosed embodiments. The present invention is intended to cover various modifications and equivalent arrangements included within the spirit and scope of the appended claims.

What is claimed is:

1. A light detecting apparatus comprising:
   a semiconductor light waveguide through which light propagates:
   a diffraction grating formed in said light waveguide, for diffracting the light propagating through said light waveguide;
   an electrode for effecting one of injecting electric current into said light waveguide and applying a voltage to said light waveguide; and
   a light detecting means including a plurality of detecting portions for detecting light diffracted by said diffraction grating to outside said light waveguide;
   a comparison circuit for comparing quantities of light incident on said plurality of detecting portions and for producing a control signal in accordance with a result of the comparing; and
   a control circuit for controlling an angle of diffraction of said diffracted light by changing, in accordance with said control signal outputted from said comparison circuit, one of the current injected through said electrode and the voltage applied by said electrode.

2. A light detecting apparatus according to claim 1, wherein said light detecting means comprises an array of light detecting elements.

3. A light detecting apparatus according to claim 1, further comprising a condensing means for condensing the diffraction light with respect to a direction perpendicular to a propagating direction of the light, said condensing means being disposed between said light waveguide and said light detecting means.

4. A light detecting apparatus according to claim 3, wherein said condensing means comprises a cylindrical lens.

5. A light detecting apparatus according to claim 1, wherein said light waveguide comprises at least a quantum well layer formed within a light wavelength distance from said diffraction grating.

6. A light detecting apparatus according to claim 5, wherein said light waveguide comprises at least a quantum well layer formed within a light wavelength distance from said diffraction grating.

7. A light detecting apparatus according to claim 1, wherein said light waveguide comprises at least two quantum well layers and a barrier layer therebetween formed within a light wavelength distance of said diffraction grating and a thickness and a potential shape of said barrier layer are set so that said barrier layer can vary a bonding state between said quantum well layers by changing a voltage applied to said light waveguide.

8. A light detecting apparatus according to claim 7, wherein the thickness of said quantum well layer is no greater than a de Broglie wavelength.

9. A light detecting apparatus according to claim 7, wherein a conduction type of said quantum well layer is one of p and n types and said barrier layer comprises a high-resistance layer.

10. A light detecting apparatus according to claim 7, wherein said barrier layer comprises a superlattice structure having a short period.

11. A light detecting apparatus according to claim 7, wherein the potential shape of said barrier layer is inclined in a flat band state.

12. A light detecting apparatus according to claim 7, wherein said quantum well layer comprises an $Al_x Ga_{1-x}As$ layer, said barrier layer comprises an $Al_y Ga_{1-y}As$ layer ($0 \leq x < y \leq 1$) and the thickness of said barrier layer is no less than 3 nm and no greater than 15 nm.

13. A light detecting apparatus according to claim 1, wherein one of said light detecting portions has a relatively short light receiving surface in the direction of propagation of the light and another of said detecting portions has a relatively long light receiving surface in the propagation direction of the light.

14. A light detecting apparatus according to claim 13, wherein said detecting portion having the relatively short light receiving surface and said detecting portion having the relatively long light receiving surface are arranged in a substantially continuous manner along the propagation direction of the light.

15. A light detecting apparatus according to claim 13, wherein said detecting portion having the relatively short light receiving surface and said detecting portion having the relatively long light receiving surface are arranged in a discrete manner along the propagation direction of the light.

16. A light detecting apparatus according to claim 1, wherein said detecting portions of said light detecting means are arranged in a plurality of rows extending along the propagation direction of the light.

17. A light detecting apparatus according to claim 16, wherein said detecting portions of said light detecting means are staggered in the propagation direction of the light.

18. A light detecting apparatus according to claim 1, further comprising at least an optical amplifier part formed along a part of said light waveguide, said optical amplifier part amplifies the incident light by injecting current thereinto.

19. A light detecting apparatus according to claim 18, wherein said optical amplifier part is disposed at a light incident side of a part of said light waveguide in which said diffraction grating is formed.

20. A light detecting apparatus according to claim 18, wherein said optical amplifier parts are disposed at both light incident and light emitting sides of a part of said light waveguide in which said diffraction grating is formed.

21. A light detecting apparatus according to claim 1, further comprising a semiconductor laser and wherein said light waveguide in which said diffraction grating is formed is disposed on an optical axis of said semiconductor laser and the control signal outputted from the comparison circuit controls at least one of an oscillation wavelength and an output power of said semiconductor laser.

22. A light detecting apparatus according to claim 21, further comprising a common substrate and wherein said semiconductor laser and said light waveguide in which said diffraction grating is formed are monolithically formed on said common substrate.

23. A light detecting apparatus according to claim 21, wherein said semiconductor laser comprises a tunable semiconductor laser.

24. A light detecting apparatus according to claim 21, wherein said semiconductor laser comprises a distributed Bragg reflection type laser.

25. A light detecting apparatus according to claim 21, wherein said semiconductor laser comprises a Fabry-Perot type laser.

26. A light detecting apparatus according to claim 25, further comprising a Peltier device and wherein the output power of said semiconductor laser is controlled by changing current injected into said semiconductor laser and the oscillation wavelength of said semiconductor laser is controlled by controlling a temperature of said semiconductor laser by said Peltier device.

27. An optical communication network comprising:
at least at transmitter end office for transmitting light signals of different wavelengths:
a receiver end office for receiving the light signals of different wavelengths, said receiver end office containing a light detecting apparatus; and
an optical transmission line for connecting said transmitter end office and said receiver end office to each other,
wherein said light detecting apparatus comprises:
a semiconductor light waveguide through which a light propagates;
a diffraction grating formed in said light waveguide, for diffracting the light propagating through said light waveguide;
an electrode for effecting one of injecting electric current into said light waveguide and applying a voltage to said light waveguide;
light detecting means including a plurality of detecting portions for detecting the light diffracted by said diffraction grating outside said light waveguide;
a comparison circuit for comparing quantities of light incident on said plurality of detecting portions and for producing a control signal in accordance with a result of the comparing; and
a control circuit for controlling an angle of diffraction of said diffracted light by changing, in accordance with said control signal from said comparison circuit, one of the electric current injected through said electrode and the voltage applied by said electrode.

28. An optical communication network comprising:
at least a transmitter end office for transmitting light signals of different wavelengths, said transmitter end office containing a light detecting apparatus;
a receiver end office for receiving the light signals of different wavelengths; and
an optical transmission line for connecting said transmitter end office and said receiver end office to each other,
wherein said light detecting apparatus comprises:
a semiconductor light waveguide through which a light propagates;
a diffraction grating formed in said light waveguide, for diffracting the light propagating through said light waveguide;
an electrode for effecting one of injecting electric current into said light waveguide and applying a voltage to said light waveguide;
light detecting means including a plurality of detecting portions for detecting the light diffracted by said diffraction grating outside said light waveguide;
a comparison circuit for comparing quantities of light incident on said plurality of detecting portions and for producing a control signal in accordance with a result of the comparing;
a control circuit for controlling an angle of diffraction of said diffracted light by changing, in accordance with said control signal from said comparison circuit, one of the electric current injected through said electrode and the voltage applied by said electrode; and
a semiconductor laser, said light waveguide in which said diffraction grating is formed being disposed on an optical axis of said semiconductor laser and the control signal from the comparison circuit being used to control at least one of an oscillation wavelength and a power output of said semiconductor laser.

* * * * *

UNITED STATES PATENT AND TRADEMARK OFFICE
CERTIFICATE OF CORRECTION

PATENT NO. : 5,299,045
DATED : March 29, 1994
INVENTOR(S) : Yoshinobu Sekiguchi            Page 1 of 4

It is certified that error appears in the above-identified patent and that said Letters Patent is hereby corrected as shown below:

Title page,

AT [30] FOREIGN APPLICATION PRIORITY DATA

Insert, "January 4, 1992 [JP] Japan .....4-18185--.

AT [56] REFERENCES CITED

U.S. Patent Documents,
"Pocholk" should read --Pochelle et al.--.

SHEET 16 OF 16

FIG. 18, "LIGHT DETECT- ING" should read --LIGHT DETECT- ING APPARATUS--.

COLUMN 1

Line 23, "is" should read --in--.
Line 63, "Feed back" should read --Feedback--.

COLUMN 2

Line 38, "of" (first occurrence) should be deleted.

COLUMN 3

Line 24, "extention" should read --extension--.

UNITED STATES PATENT AND TRADEMARK OFFICE
CERTIFICATE OF CORRECTION

PATENT NO. : 5,299,045

DATED : March 29, 1994

INVENTOR(S) : Yoshinobu Sekiguchi

It is certified that error appears in the above-identified patent and that said Letters Patent is hereby corrected as shown below:

COLUMN 4

Line 59, "a" (second occurrence) should read --an--.

COLUMN 7

Line 46, "tention" should read --tension--.

COLUMN 8

Line 32, "phenomeno-" should read --phenomenon is--.
Line 33, "nis" should be deleted.

COLUMN 11

Line 50, "stepwisely" should read --stepwise--.

COLUMN 12

Line 43, "the the" should read --the--.
Line 67, "p-$Al_zGa_{1-x}As$" should read --p-$Al_zGa_{1-z}As$--.

COLUMN 15

Line 24, "a" should be deleted.

UNITED STATES PATENT AND TRADEMARK OFFICE
CERTIFICATE OF CORRECTION

PATENT NO. : 5,299,045
DATED : March 29, 1994
INVENTOR(S) : Yoshinobu Sekiguchi           Page 3 of 4

It is certified that error appears in the above-identified patent and that said Letters Patent is hereby corrected as shown below:

COLUMN 16

Line 16, "shortened," should read --is shortened,--.

COLUMN 17

Line 8, "($0 \leq y < x < 1$)" should read --($0 \leq y < x < 1$),--.
Line 40, "noize" should read --noise--.
Line 66, "($0 \leq y < x < 1$)" should read --($0 \leq y < x < 1$),--.

COLUMN 18

Line 22, "s pressed" should read --suppressed--.

COLUMN 19

Line 25, "prat." should read --part.--.

COLUMN 20

Line 43, "a" should read --an--.
Line 52, "respective" should read --respectively--.

COLUMN 23

Line 14, "light" should read --a light--.

UNITED STATES PATENT AND TRADEMARK OFFICE
CERTIFICATE OF CORRECTION

PATENT NO. : 5,299,045

DATED : March 29, 1994

INVENTOR(S) : Yoshinobu Sekiguchi

It is certified that error appears in the above-identified patent and that said Letters Patent is hereby corrected as shown below:

<u>COLUMN 24</u>

Line 44, "amplifies" should read --amplifying--.

<u>COLUMN 25</u>

Line 18, "at transmitter" should read --a transmitter--.

Signed and Sealed this

Twenty-fourth Day of January, 1995

Attest:

BRUCE LEHMAN

Attesting Officer

Commissioner of Patents and Trademarks